United States Patent
Lee et al.

(10) Patent No.: US 12,322,435 B2
(45) Date of Patent: Jun. 3, 2025

(54) SENSE AMPLIFIER WITH READ CIRCUIT FOR COMPUTE-IN-MEMORY

(71) Applicant: Taiwan Semiconductor Manufacturing Company, Ltd., Hsinchu (TW)

(72) Inventors: Chieh Lee, Hsinchu (TW); Chia-En Huang, Hsinchu County (TW); Yi-Ching Liu, Hsinchu (TW); Wen-Chang Cheng, Richmond, TX (US); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 379 days.

(21) Appl. No.: 17/692,996

(22) Filed: Mar. 11, 2022

(65) Prior Publication Data

US 2023/0023505 A1 Jan. 26, 2023

Related U.S. Application Data

(60) Provisional application No. 63/224,927, filed on Jul. 23, 2021.

(51) Int. Cl.
| | |
|---|---|
| *G11C 11/4091* | (2006.01) |
| *G11C 5/06* | (2006.01) |
| *G11C 7/06* | (2006.01) |
| *G11C 7/10* | (2006.01) |
| *G11C 11/4094* | (2006.01) |
| *G11C 11/4096* | (2006.01) |
| *G11C 11/4093* | (2006.01) |

(52) U.S. Cl.
CPC ......... *G11C 11/4091* (2013.01); *G11C 5/063* (2013.01); *G11C 7/06* (2013.01); *G11C 7/062* (2013.01); *G11C 7/065* (2013.01); *G11C 7/1078* (2013.01); *G11C 11/4094* (2013.01); *G11C 11/4096* (2013.01); *G11C 7/1051* (2013.01); *G11C 11/4093* (2013.01)

(58) Field of Classification Search
CPC . G11C 11/4091; G11C 5/063; G11C 11/4094; G11C 11/4096; G11C 11/4093; G11C 5/025; G11C 7/062; G11C 7/065; G11C 7/067; G11C 7/1006; G11C 7/1042; G11C 7/1075; G11C 7/1051; G11C 7/06; G11C 7/1078
See application file for complete search history.

(56) References Cited

U.S. PATENT DOCUMENTS

| | | | | |
|---|---|---|---|---|
| 6,088,276 A | * | 7/2000 | Ukita | G11C 8/12 365/207 |
| 7,200,061 B2 | * | 4/2007 | Sekiguchi | G11C 11/4094 365/207 |
| 10,170,570 B1 | * | 1/2019 | Sonehara | H10B 63/34 |

(Continued)

*Primary Examiner* — Huan Hoang
*Assistant Examiner* — Justin Bryce Heisterkamp
(74) *Attorney, Agent, or Firm* — Merchant & Gould P.C.

(57) ABSTRACT

A memory device including a memory array configured to store data, a sense amplifier circuit coupled to the memory array, and a read circuit coupled to the sense amplifier circuit, wherein the read circuit includes a first input that receives a read column select signal for activating the read circuit to read the data out of the memory array through the read circuit during a read operation.

20 Claims, 19 Drawing Sheets

(56) References Cited

U.S. PATENT DOCUMENTS

| | | | | |
|---|---|---|---|---|
| 2008/0025113 A1* | 1/2008 | Kitagawa | ............ | G11C 11/4097 |
| | | | | 365/207 |
| 2008/0123395 A1* | 5/2008 | Nakai | ................ | G11C 13/0069 |
| | | | | 365/163 |
| 2009/0175066 A1* | 7/2009 | Kim | .................... | G11C 11/4091 |
| | | | | 365/189.15 |
| 2014/0347945 A1* | 11/2014 | Venkata | ................... | G11C 7/12 |
| | | | | 365/205 |
| 2015/0332740 A1* | 11/2015 | Venkata | ................... | G11C 5/06 |
| | | | | 365/63 |
| 2018/0366165 A1* | 12/2018 | Hush | .................... | G11C 7/1006 |
| 2019/0042199 A1* | 2/2019 | Sumbul | .................... | G11C 7/12 |
| 2022/0139447 A1* | 5/2022 | Shang | ................ | G11C 11/4097 |
| | | | | 365/63 |

\* cited by examiner

SENSE AMPLIFIER WITH READ CIRCUIT FOR COMPUTE-IN-MEMORY

CROSS-REFERENCE TO RELATED APPLICATIONS

This application claims the benefit of U.S. Provisional Patent Application No. 63/224,927, filed on Jul. 23, 2021, the disclosure of which is incorporated by reference in its entirety.

BACKGROUND

Typically, compute-in-memory (CIM) systems store information in random-access memory (RAM) of one or more computer systems and perform calculations at the memory device level. In CIM systems, data is accessed more quickly from the RAM than from other storage devices, such that the data can be analyzed more quickly. This enables faster reporting and decision-making in business and machine learning applications. The RAM, such as dynamic random-access memory (DRAM), often includes sense amplifiers (SAs) coupled to bit lines (BLs) of a memory array, which are coupled to memory cells of the memory array. The SAs are also coupled to inverted bit lines (BLBs) that are pre-charged to a reference voltage or coupled to reference cells. To read a memory cell, a word line is activated to address the memory cell, and the voltage stored on the memory cell disturbs or affects the voltage on the BL. The SA compares the voltage on the BL to the reference voltage on the BLB and proceeds to latch in a state of the memory cell. A column select line, that is used for both reading and writing the memory cell, is activated to transfer the voltages on the BL and the BLB to input/output (IO) lines and a secondary SA for outputting the state of the memory cell. In some memories, the SAs are coupled to data lines (DLs) and inverted data lines, i.e., data line bars, (DLBs), which are coupled to BLs of a memory array. The BLs are coupled to memory cells on one side of the memory cells and source lines (SLs) are coupled to the memory cells on the other side of the memory cells. Also, the SLs can be coupled to a reference, such as ground. To read a memory cell, a word line is activated to address the memory cell, and the voltage stored on the memory cell disturbs or affects the voltage on the BL, which affects a corresponding DL and a corresponding DLB. The SA compares the voltage on the DL to the voltage on the DLB to latch in a state of the memory cell. A column select line, that is used for both reading and writing the memory cell, is activated to transfer the voltages on the DL and the DLB to IO lines and a secondary SA for outputting the state of the memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
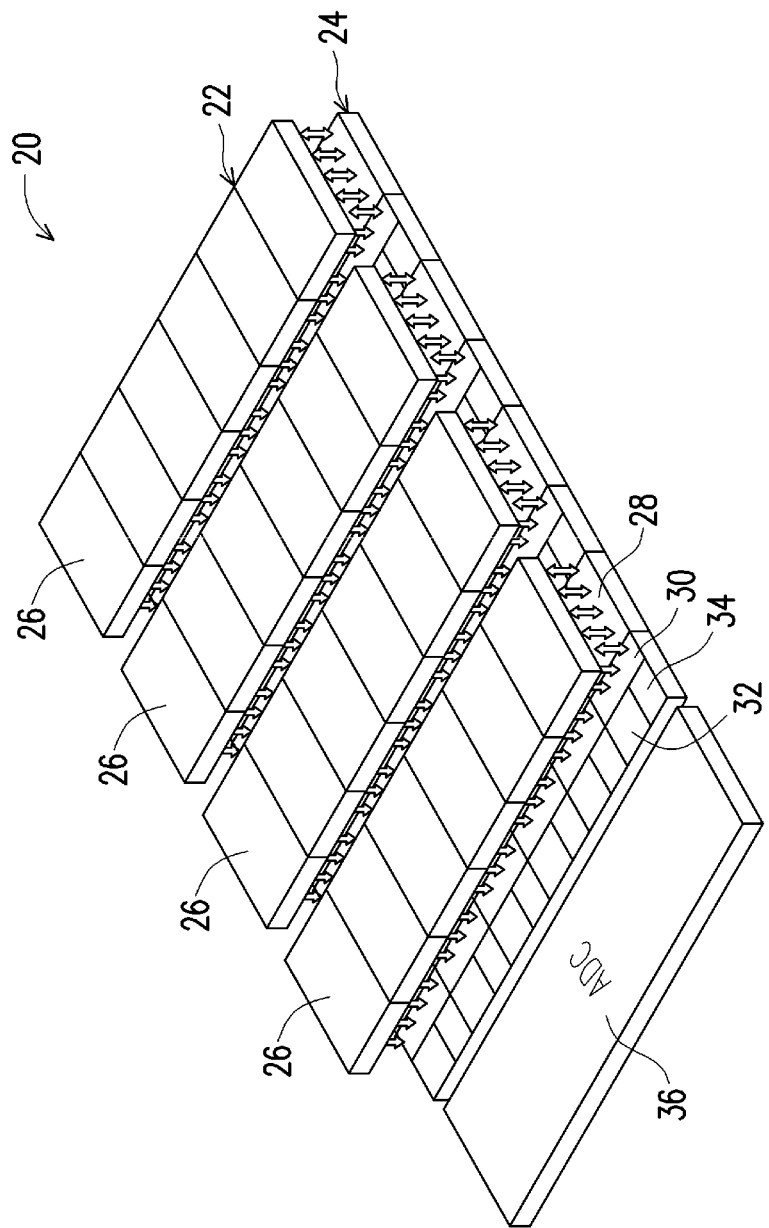
FIG. 1 is a diagram schematically illustrating a memory device including a memory device array situated above or on top of memory device circuits, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As noted above, a column select line is used for both reading and writing a memory cell. In addition, the read and write functions share the same IO lines, such that voltages from previous read/write operations and/or from pre-charging the IO lines may remain on the IO lines. These voltages on the IO lines, during a read operation, may change the voltages on at least one of the BL and the BLB of the SA or on at least one of the DL and the DLB of the SA, resulting in a bit flipping from one state to another state and reliability problems.

Disclosed embodiments include at least one read circuit connected to a SA in a memory device having a back-end-of-line (BEOL) memory array situated above or on top of front-end-of-line (FEOL) circuits, where the at least one read circuit and the SA are FEOL circuits situated under the memory array. The read circuit is connected to the SA for reading sense amplifier voltages that correspond to voltages sensed from memory cells of the memory array by the SA. The read circuit includes a read column select (RCS) input, a read output port (also referred to herein as a read port), and a read path that is activated by an RCS signal received by the RCS input for reading the sense amplifier voltages during a read operation. Also, the SA includes one or more write column select (WCS) inputs that receive WCS signals for writing the memory cells during a write operation. The RCS input and the RCS signal are separate from the WCS inputs and the WCS signals, such that the RCS function and WCS function are decoupled from one another. Using the read circuit, the sense amplifier voltages that correspond to the sensed voltages from the memory cells are not disturbed or changed during the read operation. In some embodiments, the read circuit is part of the SA. In some embodiments, the read circuit is a separate circuit electrically connected to the SA.

Using the read circuit increases the speed of reading the memory cells, where the sense amplifier voltages are not transferred to a secondary SA to be output. Instead, the sense amplifier voltages are read by the read circuit and corresponding output voltages are provided by the read circuit through the read output port. In some embodiments, the sense amplifier voltages are read by the read circuit and the read output port provides output voltages that correspond to the sense amplifier voltages directly to an analog-to-digital converter (ADC). In some embodiments, the sense amplifier voltages are read by the read circuit and the read output port provides output voltages that correspond to the sense amplifier voltages directly to the ADC and outputs from the ADC are provided directly to CIM circuits. In some embodiments, the sense amplifier voltages are read by the read circuit and the read output port provides output voltages that correspond to the sense amplifier voltages directly to CIM circuits.

In some embodiments, each read circuit includes at least two transistors, where the gate of one of the at least two transistors is connected to one of the BL and the BLB of the SA. In some embodiments, a gate of another transistor is connected to the other one of the BL and the BLB of the SA to balance loading on the BL and the BLB of the SA. In some embodiments, a first read circuit is connected to one of the BL and the BLB of the SA and a second read circuit is connected to the other one of the BL and the BLB of the SA, to provide differential outputs for reading the memory cells. In some embodiments, the SA includes or is connected to a plurality of read circuits for reading a plurality of memory cells.

In some embodiments, each read circuit includes at least two transistors, where the gate of one of the at least two transistors is connected to one of the DL and the DLB of the SA. In some embodiments, a gate of another transistor is connected to the other one of the DBL and the DLB of the SA to balance loading on the DL and the DLB of the SA. In some embodiments, a first read circuit is connected to one of the DL and the DLB of the SA and a second read circuit is connected to the other one of the DL and the DLB of the SA, to provide differential outputs for reading the memory cells. In some embodiments, the SA includes or is connected to a plurality of read circuits for reading a plurality of memory cells.

In some embodiments, each read circuit includes at least two transistors that are metal-oxide semiconductor field-effect transistors (mosfets), such as n-channel mosfets (NMOS) or p-channel mosfets (PMOS). In some embodiments, the at least two transistors are all NMOS transistors. In some embodiments, the at least two transistors are all PMOS transistors. In some embodiments, the at least two transistors include one or more NMOS transistors and one or more PMOS transistors.

Advantages of the memory device including the SA and the read circuit include: decoupling the RCS function and the WCS function from one another; maintaining, i.e., not disturbing or changing, the sense amplifier voltages by using the read circuit; increasing the speed of reading the memory cells using the read circuit, where the sense amplifier voltages are not transferred to a secondary SA; and, in some embodiments, reading the sense amplifier voltages and providing corresponding output voltages from the read output port directly to an ADC and providing outputs from the ADC directly to one or more CIM circuits. Also, in some embodiments, advantages include not restricting multiple MATs to a single data bus and enabling reading and writing data at the same time to MATs of the multiple MATs. Where a MAT is a plurality of memory cells arranged in a matrix of rows and columns.

FIG. 1 is a diagram schematically illustrating a memory device 20 including a memory device array 22 situated above or on top of memory device circuits 24, in accordance with some embodiments. In some embodiments, the memory device 20 is a CIM memory device that includes memory device circuits 24 configured to provide functions for applications, such as computational neural network (CNN) applications. In some embodiments, the memory device 20 includes a memory device array 22 that is a BEOL memory array above memory device circuits 24 that are FEOL circuits.

The memory device array 22 includes memory arrays 26. In some embodiments, each of the memory arrays 26 is a DRAM memory array including one transistor, one capacitor (1T-1C) DRAM memory cells. In some embodiments, each of the memory arrays 26 is a 1 transistor memory array including memory cells, such as 1 transistor flash memory cells.

The memory device circuits 24 include word line drivers (WLDVs) 28, SAs 30, column select (CS) circuits 32, read circuits 34, and ADC circuits 36. The WLDVs 28 and the SAs 30 are situated directly under the memory arrays 26 and electrically coupled to the memory arrays 26. The CS circuits 32 and the read circuits 34 are situated between the footprints of the memory arrays 26 and electrically coupled to the SAs 30. Each of the read circuits 34 includes a read port electrically coupled to the ADC circuits 36 that are configured to receive data from the read ports.

Figure 2:
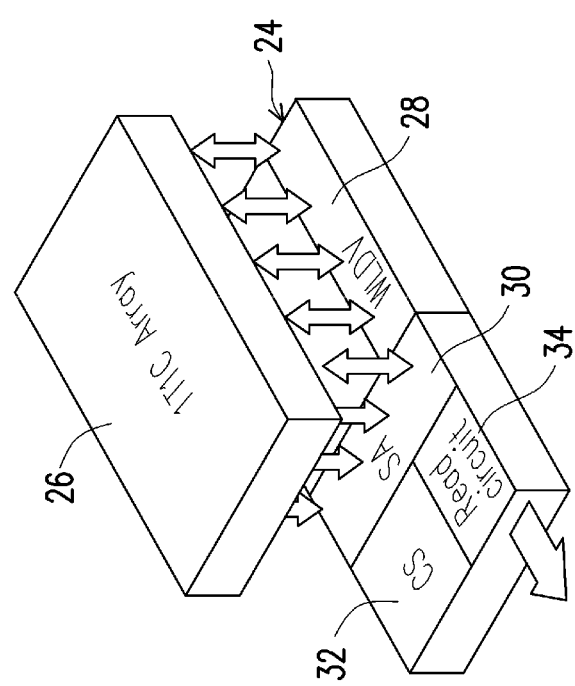
FIG. 2 is a diagram schematically illustrating one memory array electrically coupled to memory device circuits, in accordance with some embodiments.

FIG. 2 is a diagram schematically illustrating one memory array 26 electrically coupled to memory device circuits 24, in accordance with some embodiments. The memory device circuits 24 include a WLDV 28 and a SA 30 situated directly underneath and electrically coupled to the memory array 26. Also, the memory device circuits 24 include a CS circuit 32 and a read circuit 34 electrically coupled to the SA 30 and situated adjacent a footprint of the memory array 26.

In operation, the SA 30 senses voltages from memory cells in the memory array 26, and the read circuit 34 reads sense amplifier voltages from the SA 30 that correspond to the voltages sensed from the memory cells of the memory array 26 by the SA 30. The read circuit 34 includes an RCS input (not shown in FIG. 2) that receives an RCS signal from the CS circuit 32 for reading the sense amplifier voltages during a read operation. Also, the read circuit 34 provides output voltages at the read port that correspond to the sense amplifier voltages read by the read circuit 34. In addition, the SA 30 includes a WCS input (not shown in FIG. 2) that receives a WCS signal from the CS circuit 32 for writing the memory cells of the memory array 26 during a write operation. The RCS input and the RCS signal are separate from the WCS input and the WCS signal, such that the RCS function and the WCS function are decoupled from one another. In some embodiments, the read circuit 34 is part of the SA 30. In some embodiments, the read circuit 34 is a separate circuit that is electrically connected to the SA 30.

Using the read circuit 34 increases the speed of reading the memory cells of the memory array 26, where the sense amplifier voltages are not transferred to a secondary SA to be output. Instead, the sense amplifier voltages are read by the read circuit 34 and corresponding output voltages are provided by the read circuit 34 through the read output port. In some embodiments, the sense amplifier voltages are read by the read circuit 34 and the read output port provides output voltages that correspond to the sense amplifier voltages directly to the ADC circuits 36. In some embodiments, the sense amplifier voltages are read by the read circuit 34 and the read output port provides output voltages that correspond to the sense amplifier voltages directly to the ADC circuit 36 and the ADC circuit 36 provides outputs directly to CIM circuits in the memory device circuits 24. In some embodiments, the sense amplifier voltages are read by the read circuit 34 and the read output port provides output voltages that correspond to the sense amplifier voltages directly to CIM circuits in the memory device circuits 24.

Figure 3:
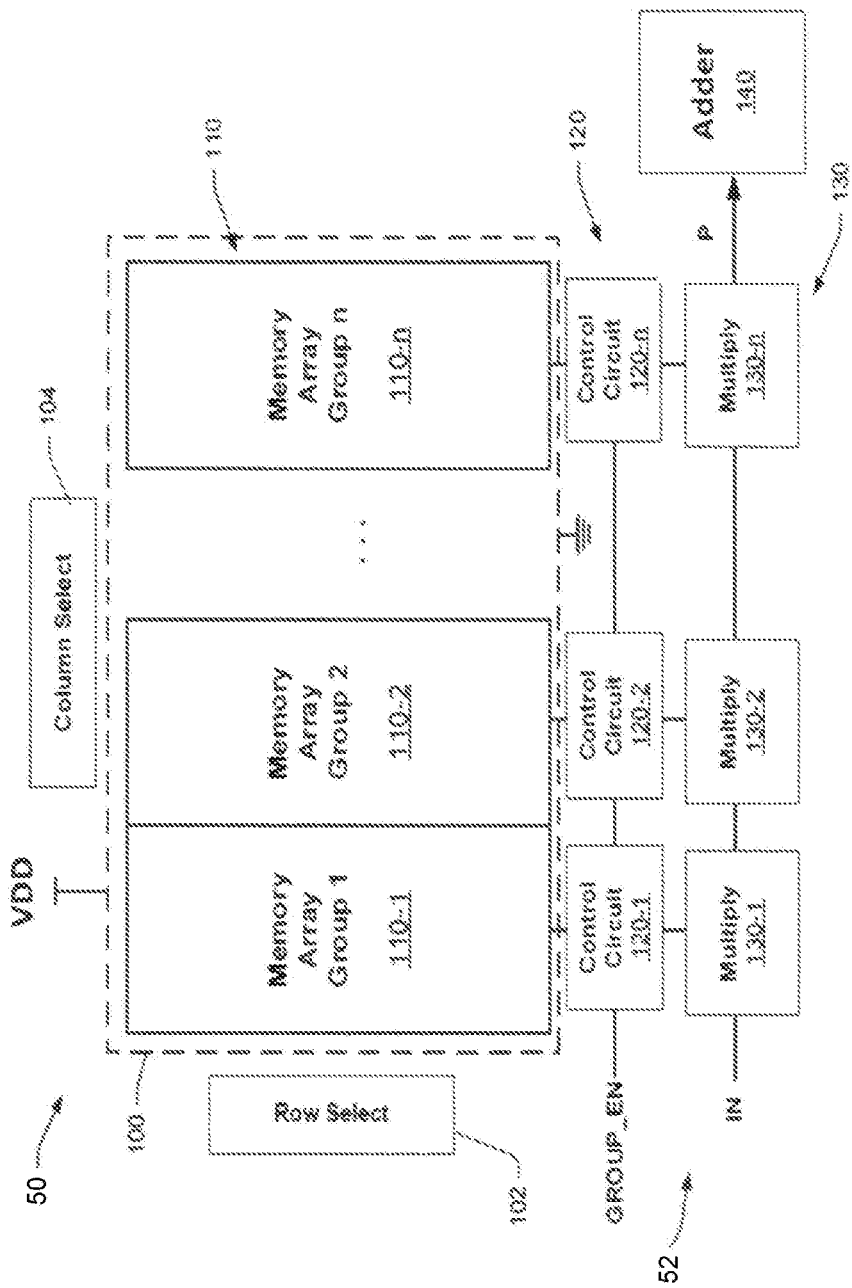
FIG. 3 is a diagram schematically illustrating an example of a CIM memory device that includes CIM circuits electrically coupled to a memory array in the CIM memory device, in accordance with some embodiments.

FIG. 3 is a diagram schematically illustrating an example of a CIM memory device 50 that includes CIM circuits 52 electrically coupled to a memory array 100 in the CIM memory device 50, in accordance with some embodiments. In some embodiments, the CIM memory device 50 is like the memory device 20 of FIG. 1. In some embodiments, the CIM circuits 52 are configured to provide functions for applications, such as computational neural network (CNN) applications. In some embodiments, the memory array 100 is a BEOL memory array situated above the CIM circuits 52 that are FEOL circuits.

In this example, the memory array 100 includes a plurality of memory cells that store CIM weight signals. The memory array 100 and associated circuits are connected between a power terminal configured to receive a VDD voltage and a ground terminal. The memory array 100 includes a plurality of memory array groups 110 that each include memory cells arranged in rows and columns. A row select circuit 102 and a column select circuit 104 are connected to the memory array 100 and configured to select memory cells in rows and columns of the memory array 100 during read and write operations.

The memory array 100 includes a first memory array group 110-1, a second memory array group 110-2, and so on, through an nth memory array group 110-$n$. A control circuit 120 is connected to bit lines of the memory array 100 and configured to select a first group of memory cells or a second group of memory cells in response to a group enable signal GROUP_EN. The control circuit 120 includes control circuits 120-1, 120-2 ... 120-$n$ connected to the memory array groups 110-1, 110-2 ... 110-$n$, respectively.

The CIM circuits 52 include a multiply circuit 130 and an adder circuit 140. An input terminal is configured to receive a CIM input signal IN, and the multiply circuit 130 is configured to multiply selected weight signals stored in the memory array 100 by the input signals IN to generate a plurality of partial products P. The multiply circuit 130 includes multiply circuits 130-1, 130-2 ... 130-$n$. The partial products P are output to the adder circuit 140 that is configured to add the partial products P to produce a CIM output.

Figure 4:
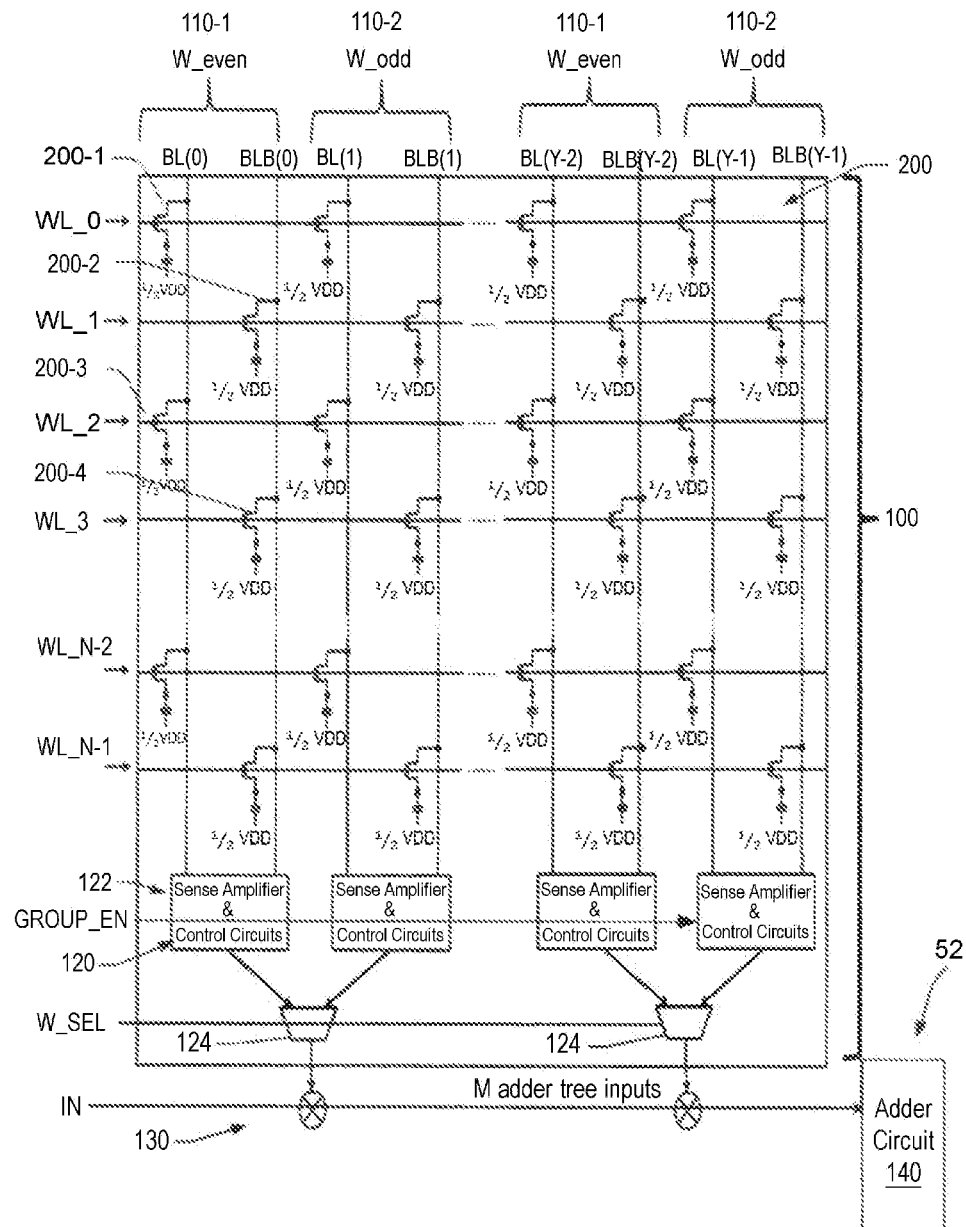
FIG. 4 is a diagram schematically illustrating examples of the memory array and CIM circuits, in accordance with some embodiments.

FIG. 4 is a diagram schematically illustrating examples of the memory array 100 and corresponding CIM circuits 52, in accordance with some embodiments. In these examples, the memory array 100 includes a plurality of memory cells 200, including memory cells 200-1, 200-2, 200-3, and 200-4, arranged in rows and columns. The memory array 100 has N rows, where each row of the N rows has a corresponding word line WL, designated as one of the word lines WL_0 through WL_N-1. Each of the plurality of memory cells 200 is coupled to the word line WL of its row. Also, each column of the array 100 has a bit line BL and a bit line bar (inverted bit line) BLB. In these examples, the memory array 100 has Y columns, such that the bit lines are designated as bit lines BL[0] through BL[Y-1] and BLB[0]

through BLB[Y−1]. Each of the plurality of memory cells 200 is coupled to one of the bit lines BL and BLB in its column. In some embodiments, the word lines WL and the bit lines BL and BLB include conductive traces or lines formed by a conductive material, such as metal or silicided/polycided polysilicon.

SAs 122 and control circuits 120 are connected to the bit lines BL and BLB and multiplexers (MUXs) 124 are connected to the outputs of the SAs 122 and the control circuits 120. In response to a weight select signal W_SEL, the MUXs 124 output selected weight signals retrieved from the memory array 100 to the multiply circuits 130. In these examples, the memory array 100 is arranged in two memory array groups 110-1 and 110-2, with the first group 110-1 including the even columns, i.e., containing even numbered bit lines BL[0] and BLB[0], and so on, to BL[Y−2] and BLB[Y−2]), and the second group 110-2 including the odd columns, i.e., containing odd numbered bit lines BL[1] and BLB[1], and so on, to BL[Y−1] and BLB[Y−1]. The control circuits 120 are configured to select the first group 110-1 of memory cells or the second group 110-2 of memory cells in response to the group enable signal GROUP_EN.

Each of the memory cells 200 in the memory array 100 stores a high voltage, a low voltage, or a reference voltage. The memory cells 200 in the memory array 100 are 1T-1C memory cells in which a voltage is stored on a capacitor. In other embodiments, the memory cells 200 can be another type of memory cell, such as other 1 transistor memory cells or multiple transistor memory cells.

Figure 5:
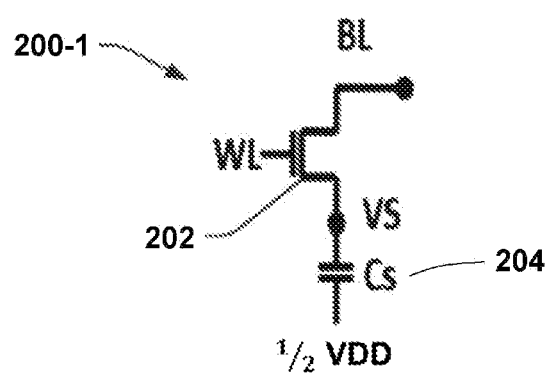
FIG. 5 is a diagram schematically illustrating a 1T-1C memory cell of the memory array, in accordance with some embodiments.

FIG. 5 is a diagram schematically illustrating the memory cell 200-1 of the 1T-1C memory cells 200 of the memory array 100, in accordance with some embodiments. The memory cell 200-1 has one transistor, such as a metal-oxide semiconductor field-effect transistor (mosfet) 202 and one storage capacitor 204. The transistor 202 operates as a switch, interposed between the storage capacitor 204 and the bit line BL of the memory cell 200-1. A first source/drain terminal (S/D) of the transistor 202 is connected to the bit line BL and a second S/D terminal of the transistor 202 is connected to a first terminal of the capacitor 204. A second terminal of the capacitor 204 is connected to a voltage terminal that receives a reference voltage, such as ½VDD. The memory cell 200-1 stores a bit of information as electric charge on the capacitor 204. The gate of the transistor 202 is connected to one of the word lines WL for accessing the memory cell 200-1. In some embodiments VDD is 1.0 volt (V). In other embodiments, the second terminal of the capacitor 204 is connected to a voltage terminal that receives a reference voltage such as ground.

In reference to FIG. 4, each of the word lines WL is connected to multiple memory cells of the plurality of memory cells 200, with each row of the memory array 100 having a corresponding WL. Also, each column of the memory array 100 includes a bit line BL and a bit line bar BLB. The first column of the memory array 100 includes BL[0] and BLB[0], the second column of the memory array 100 includes BL[1] and BLB[1], and so on, through the Yth column that includes BL[Y−1] and BLB[Y−1]. Each bit line BL and bit line bar BLB is connected to every other memory cell 200 in a column. Thus, the memory cell 200-1, shown in the leftmost column of the memory array 100, is connected to the bit line BL[0], the memory cell 200-2 is connected to the bit line bar BLB[0], the memory cell 200-3 is connected to the bit line BL[0], and the memory cell 200-4 is connected to the bit line bar BLB[0], and so on.

Each column of the memory array 100 has a SA 122 connected to the bit line BL and the bit line bar BLB of that column. The SAs 122 include a pair of cross-connected inverters between the bit line BL and the bit line bar BLB, with a first inverter having an input connected to the bit line BL and an output connected to the bit line bar BLB, and the second inverter having an input from the bit line bar BLB and an output connected to the bit line BL. This results in a positive feedback loop that stabilizes with one of the bit line BL and the bit line bar BLB at a high voltage and the other one of the bit line BL and the bit line bar BLB at a low voltage.

In a read operation, word lines and bit lines are selected based on an address received by the row select circuit 102 and the column select circuit 104. Bit lines BLs and bit line bars BLBs in the memory array 100 are pre-charged to a voltage between a high voltage, such as VDD, and a low voltage, such as ground. In some embodiments, the bit lines BLs and the bit line bars BLBs are pre-charged to ½ VDD.

Further, word lines WL for selected rows are driven to access the information stored in selected memory cells 200. If the transistors in the memory array 100 are NMOS transistors, the word lines are driven to a high voltage to turn on the transistors and connect the storage capacitors to the corresponding bit lines BLs and bit line bars BLBs. If the transistors in the memory array 100 are PMOS transistors, the word lines are driven to a low voltage to turn on the transistors and connect the storage capacitors to the corresponding bit lines BLs and bit line bars BLBs.

Connecting a storage capacitor to a bit line BL or to a bit line bar BLB, changes the charge/voltage on that bit line BL or bit line bar BLB from the pre-charged voltage level to a higher or a lower voltage. This new voltage is compared to another voltage by one of the SAs 122 to determine the information stored in the memory cell 200.

In some embodiments, to sense this new voltage, one of the control circuits 120 selects a SA 122 in response to the GROUP_EN signal and voltages from the bit line BL and the bit line bar BLB (or a reference memory cell) are provided to the SA 122. The SA 122 compares these voltages and a read circuit, such as one of the read circuits 34, provides an output to an ADC circuit, such as ADC circuit 36. The ADC circuit provides an ADC output to one of the MUXs 124 that provides a MUX output to one of the multiply circuits 130, where the CIM input signal IN is combined with the CIM weight signals. The multiply circuit 130 further provides partial products P to the adder circuit 140 that is configured to add the partial products P to produce a CIM output.

In a write operation, word lines and bit lines are selected based on an address received by the row select circuit 102 and the column select circuit 104. To write a memory cell, such as memory cell 200-1, the word line WL_0 is driven high to access the storage capacitor 204 and a high or low voltage is written into the memory cell 200-1 by driving the bit line BL[0] to the high or low voltage level, which charges or discharges the storage capacitor 204 to the selected voltage level.

Figure 6:
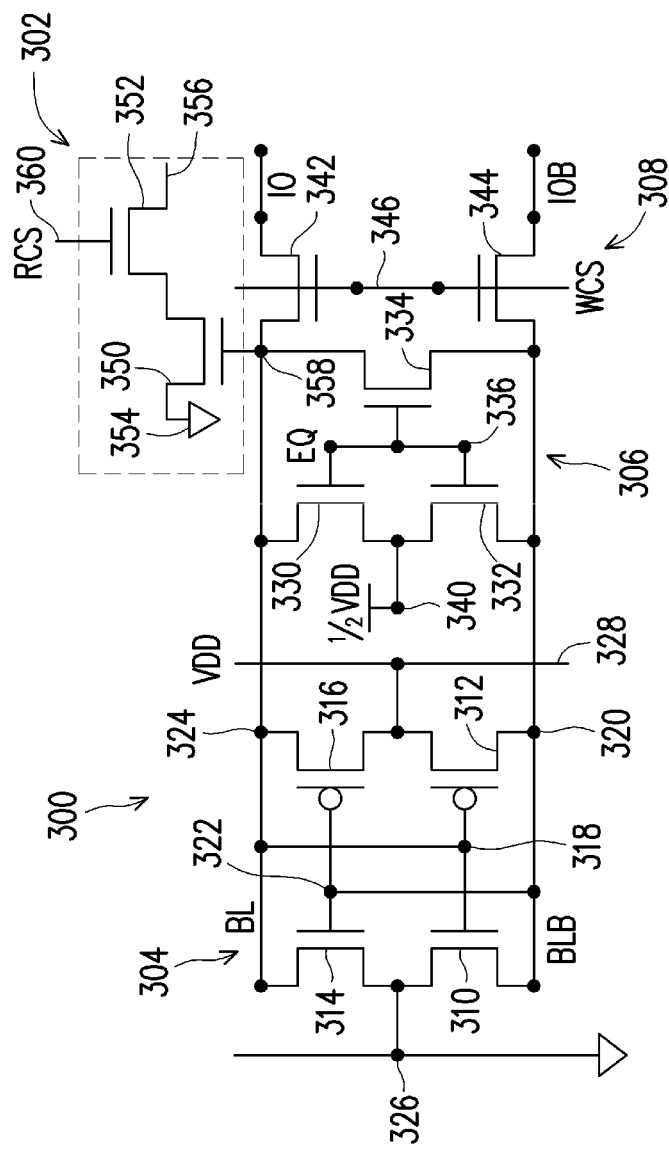
FIG. 6 is a diagram schematically illustrating a SA and a read circuit, in accordance with some embodiments.

FIGS. 6-9 and 11 are diagrams schematically illustrating SA circuits that include a SA and one or more read circuits. FIG. 6 is a diagram schematically illustrating a SA 300 and a read circuit 302, in accordance with some embodiments. The read circuit 302 is electrically connected to the SA 300 for reading sense amplifier voltages that correspond to voltages sensed by the SA 300 from memory cells, such as the memory cells 200, of a memory array, such as the memory array 100 and/or the memory arrays 22 and 26. In some embodiments, the SA 300 is like the SA 30 (shown in FIGS. 1 and 2). In some embodiments, the SA 300 is like the SA 122 (shown in FIG. 4). In some embodiments, the read circuit 302 is like the read circuit 34 (shown in FIGS. 1 and 2). In some embodiments, the read circuit 302 is part of the SA 300. In some embodiments, the read circuit 302 is a separate circuit electrically connected to the SA 300.

In this example, the SA 300 and the read circuit 302 include NMOS transistors and PMOS transistors in one configuration. Of course, it is to be understood that in other embodiments, the SA 300 and the read circuit 302 can include NMOS transistors and PMOS transistors in another configuration. For example, in other embodiments, at least some of the NMOS transistors and PMOS transistors of the current configuration can be switched.

The SA 300 includes a cross-coupled latch 304, also referred to herein as a pair of cross-connected inverters, a bit line equalization circuit 306, and a write circuit 308. Each of the cross-coupled latch 304 and the bit line equalization circuit 306 is situated between the bit line BL and the bit line bar BLB.

The cross coupled latch 304 includes a first NMOS transistor 310, a first PMOS transistor 312, a second NMOS transistor 314, and a second PMOS transistor 316. The first NMOS transistor 310 and the first PMOS transistor 312 make up one of the cross-connected inverters, and the second NMOS transistor 314 and the second PMOS transistor 316 make up the other cross-connected inverter. The gates at 318 of the first NMOS transistor 310 and the first PMOS transistor 312 are connected to each other and to the bit line BL, and the outputs at 320 of the first NMOS transistor 310 and the first PMOS transistor 312 are connected to each other and to the bit line bar BLB. The gates at 322 of the second NMOS transistor 314 and the second PMOS transistor 316 are connected to each other and to the bit line bar BLB, and the outputs at 324 of the second NMOS transistor 314 and the second PMOS transistor 316 are connected to each other and to the bit line BL. The drain/source paths of the first and second NMOS transistors 310 and 314 are connected to each other and to a reference 326, such as ground, and the drain/source paths of the first and second PMOS transistors 312 and 316 are connected to each other and to power 328, such as VDD. This results in positive feedback that stabilizes one of the bit line BL and the bit line bar BLB at a high voltage and the other one of the bit line BL and the bit line bar BLB at a low voltage.

The bit line equalization circuit 306 includes a first NMOS transistor 330, a second NMOS transistor 332, and a third NMOS transistor 334. The gates at 336 of the first, second, and third NMOS transistors 330, 332, and 334 are connected to each other and to an equalization signal input EQ. The drain/source path of the first NMOS transistor 330 is connected to the drain/source path of the second NMOS transistor 332 and to a reference voltage 340, such as ½VDD. The other side of the drain/source path of the first NMOS transistor 330 is connected to bit line BL and the other side of the drain/source path of the second NMOS transistor 332 is connected to bit line bar BLB. The drain/source path of the third NMOS transistor 334 is connected on one side to the bit line BL and on the other side to the bit line bar BLB.

In operation, the equalization signal EQ is set to a high voltage to turn on all three NMOS transistors 330, 332, and 334. The first and second NMOS transistors 330 and 332 provide the reference voltage, such as ½VDD, to the bit line BL and to the bit line bar BLB, and the third transistor 334 equalizes the voltages on the bit line BL and the bit line bar BLB. The equalization signal EQ is then set to a low voltage to switch off the first, second, and third NMOS transistors 330, 332, and 334.

The write circuit 308 includes a first NMOS transistor 342 and a second NMOS transistor 344. The first NMOS transistor 342 has a drain/source path connected in series with the bit line BL and the second NMOS transistor 344 has a drain/source path connected in series with the bit line bar BLB. The gates at 346 of the first and second NMOS transistors 342 and 344 are coupled to each other and to a write input WCS to receive a WCS signal for writing the memory cells of the memory array during a write operation.

In a write operation, the WCS signal is set to a high voltage to turn on the first and second NMOS transistors 342 and 344. Selected voltages are provided to the IO line and the IOB line at the drain source paths of the first and second NMOS transistors 342 and 344, respectively, to drive the bit line BL and bit line bar BLB to the selected voltages, which charges and discharges the storage capacitors in the memory cells to the selected voltages.

The read circuit 302 is connected to the SA 300 for reading sense amplifier voltages that correspond to voltages sensed from memory cells, such as memory cells 200, of the memory array, such as memory array 100, by the SA 300. The read circuit 302 includes a first NMOS transistor 350 and a second NMOS transistor 352. One side of the drain/source path of the first NMOS transistor 350 is connected to a reference 354, such as ground, and the other side of the drain/source path of the first NMOS transistor 350 is connected to one side of the drain/source path of the second NMOS transistor 352. The other side of the drain/source path of the second NMOS transistor 352 provides a read output port 356. The gate at 358 of the first NMOS transistor 350 is connected to the bit line BL to sense the sense amplifier voltage on the bit line BL and the gate at 360 of the second NMOS transistor 352 is connected to a read input RCS to receive the RCS signal. A read path through the drain/source paths of the first and second NMOS transistors 350 and 352 is activated by a high voltage RCS signal at the read input RCS for reading the sense amplifier voltages during a read operation. The read input RCS and the RCS signal are separate from the write input WCS and the WCS signal, such that the RCS read function and the WCS write function are decoupled from one another.

In a read operation, the bit line BL and the bit line bar BLB are pre-charged to a voltage level, such as ½VDD, by activating the equalization circuit 306 via a high voltage equalization signal EQ. Also, word lines and bit lines are selected based on an address received by a row select circuit, such as row select circuit 102, and a column select circuit, such as column select circuit 104. The word lines, such as word lines WL, for selected rows are driven to access the data stored in the memory cells, such as memory cells 200, where storage capacitors, such as storage capacitor 204, are coupled to the corresponding bit line BL and bit line bar BLB. This changes the voltage on the bit line BL and the bit line bar BLB to a higher or lower voltage based on the data stored in the selected memory cells.

Further, the SA 300 is selected by a control circuit, such as one of the control circuits 120, and the SA 300 receives the bit line BL and the bit line bar BLB voltages, and proceeds to set the cross-coupled latch circuit 304. A high voltage RCS signal is received at the read input RCS to activate the read path through the drain/source paths of the first and second NMOS transistors 350 and 352. If the voltage on the bit line BL is low, the first NMOS transistor 350 is biased off or toward non-conducting and the read output port 356 provides a high impedance value or a high voltage level. If the voltage on the bit line BL is high, the first NMOS transistor 350 is biased on or conducting and the read output port 356 provides a low voltage level, such as ground.

Using the read circuit 302, the sense amplifier voltages on the bit line BL and the bit line bar BLB, which correspond to the sensed voltages from the memory cells, are not disturbed or changed during the read operation. Also, using the read circuit 302 increases the speed of reading the memory cells, where the sense amplifier voltages are not transferred to a secondary SA to be output. Instead, the sense amplifier voltages are read by the read circuit 302 and corresponding output voltages are provided by the read circuit 302 at the read output port 356.

In some embodiments, the sense amplifier voltages are read by the read circuit 302 and the read output port 356 provides output voltages that correspond to the sense amplifier voltages directly to an ADC. In some embodiments, the sense amplifier voltages are read by the read circuit 302 and the read output port 356 provides output voltages that correspond to the sense amplifier voltages directly to the ADC and the ADC provides outputs directly to CIM circuits. In some embodiments, the sense amplifier voltages are read by the read circuit 302 and the read output port 356 provides output voltages that correspond to the sense amplifier voltages directly to CIM circuits.

Figure 7:
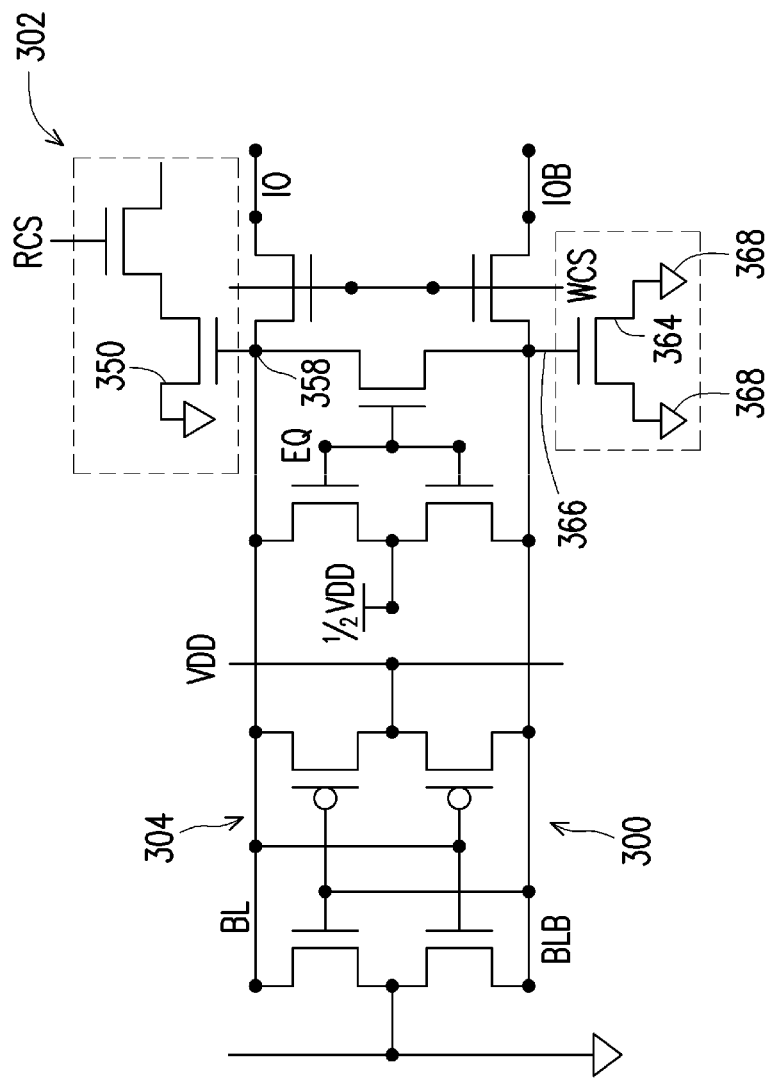
FIG. 7 is a diagram schematically illustrating a load balancing NMOS transistor electrically connected to the SA and the read circuit of FIG. 6, in accordance with some embodiments.

FIG. 7 is a diagram schematically illustrating a load balancing NMOS transistor 364 electrically connected to the SA 300 and the read circuit 302 of FIG. 6, in accordance with some embodiments. The SA 300 and the read circuit 302 are the same as the SA 300 and the read circuit 302 of FIG. 6, and they will not be described again here.

The NMOS transistor 364 includes a gate 366 electrically connected to the bit line bar BLB of the SA 300. Also, each side of the drain/source path of the NMOS transistor 364 is electrically connected to a reference 368, such as ground.

The gate at 358 of the first NMOS transistor 350 in the read circuit 302 is connected to the bit line BL to sense the sense amplifier voltages on the bit line BL. The gate at 358 provides at least a load capacitance on the bit line BL, such that charging and discharging of the bit line BL (with the connected gate) is different from charging and discharging of the bit line bar BLB (without a connected gate). This incongruity results in an imbalance in the voltages on the bit line BL and the bit line bar BLB, which could result in inaccurately sensing the voltages from the memory cells. By connecting the gate 366 of the NMOS transistor 364 to the bit line bar BLB, the loads including the capacitive loads on each of the bit line BL and the bit line bar BLB are more evenly balanced, i.e., more closely the same, which improves the sensing of the voltages from the memory cells by the SA 300.

Figure 8:
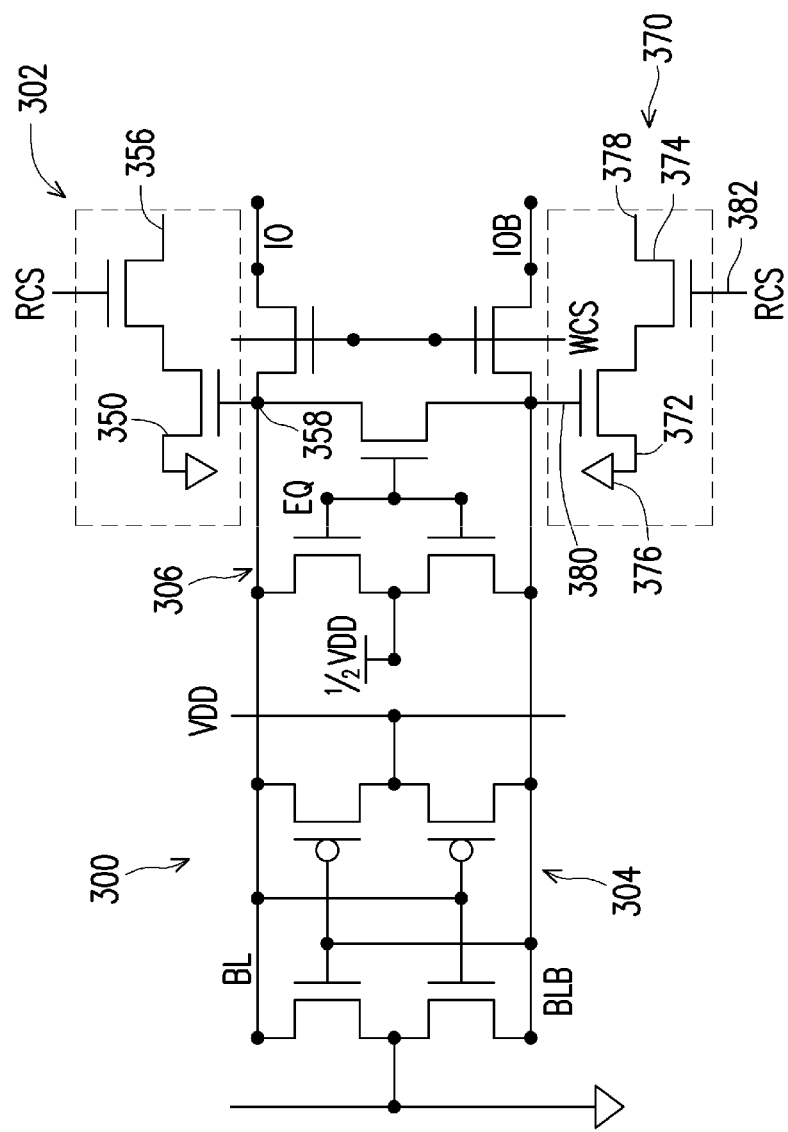
FIG. 8 is a diagram schematically illustrating a second read circuit electrically connected to the SA and the read circuit of FIG. 6, in accordance with some embodiments.

FIG. 8 is a diagram schematically illustrating a second read circuit 370 electrically connected to the SA 300 and the read circuit 302 (the first read circuit) of FIG. 6, in accordance with some embodiments. In a read operation, the SA 300, the first read circuit 302, and the second read circuit 370 provide differential output voltages, such that one of the outputs from the read circuits 302 and 370 is a higher voltage and the other is a lower voltage. The SA 300 and the read circuit 302 are the same as the SA 300 and the read circuit 302 of FIG. 6, and they will not be described again here.

The second read circuit 370 is connected to the SA 300 for reading sense amplifier voltages that correspond to voltages sensed from memory cells, such as memory cells 200, of the memory array, such as memory array 100, by the SA 300. The second read circuit 370 includes a first NMOS transistor 372 and a second NMOS transistor 374. One side of the drain/source path of the first NMOS transistor 372 is connected to a reference 376, such as ground, and the other side of the drain/source path of the first NMOS transistor 372 is connected to one side of the drain/source path of the second NMOS transistor 374. The other side of the drain/source path of the second NMOS transistor 374 provides a read output port 378. The gate at 380 of the first NMOS transistor 372 is connected to the bit line bar BLB to sense the sense amplifier voltage on the bit line bar BLB and the gate at 382 of the second NMOS transistor 374 is connected to a read input RCS to receive the RCS signal. A read path through the drain/source paths of the first and second NMOS transistors 372 and 374 is activated by the RCS signal received by the read input RCS for reading the sense amplifier voltages during a read operation. The read inputs RCS and the RCS signal are separate from the write input WCS and the WCS signal, such that the RCS read function and the WCS write function are decoupled from one another.

The gate at 358 of the first NMOS transistor 350 in the first read circuit 302 is connected to the bit line BL to sense the sense amplifier voltages on the bit line BL. The gate at 358 provides at least a load capacitance on the bit line BL, such that charging and discharging of the bit line BL (with the connected gate) is different from charging and discharging of the bit line bar BLB (without a connected gate). This incongruity results in an imbalance in the voltages on the bit line BL and the bit line bar BLB, which could result in inaccurately sensing the voltages from the memory cells. By connecting the gate 380 of the first NMOS transistor 372 to the bit line bar BLB, the loads including the capacitive loads on each of the bit line BL and the bit line bar BLB are more evenly balanced, i.e., more closely the same, which improves the sensing of the voltages from the memory cells by the SA 300.

In a read operation, the bit line BL and the bit line bar BLB of the SA 300 are pre-charged to a voltage level, such as ½VDD, by activating the equalization circuit 306 via a high voltage equalization signal EQ. Also, word lines and bit lines are selected based on an address received by a row select circuit, such as row select circuit 102, and a column select circuit, such as column select circuit 104. The word lines, such as word lines WL, for selected rows are driven to access the data stored in the memory cells, such as memory cells 200, where storage capacitors, such as storage capacitor 204, are coupled to the corresponding bit line BL and the bit line bar BLB. This changes the voltage on the corresponding bit line BL and the bit line bar BLB to a higher or lower voltage level based on the data stored in the selected memory cells.

Further, the SA 300 is selected by a control circuit, such as one of the control circuits 120, and the SA 300 receives the bit line BL and bit line bar BLB voltage levels, and proceeds to set the cross-coupled latch circuit 304. A high voltage RCS signal is received at the read inputs RCS to activate the read path in the first read circuit 302 through the drain/source paths of the first and second NMOS transistors 350 and 352 and to activate the read path in the second read circuit 370 through the drain/source paths of the first and second NMOS transistors 372 and 374. In the first read circuit 302, if the voltage on the bit line BL is low, the first NMOS transistor 350 is biased off or toward non-conducting and the read output port 356 provides a high impedance value or a higher voltage level, and if the voltage on the bit line BL is high, the first NMOS transistor 350 is biased on or conducting and the read output port 356 provides a lower voltage level, such as ground. In the second read circuit 370, if the voltage on the bit line bar BLB is low, the first NMOS transistor 372 is biased off or toward non-conducting and the read output port 378 provides a high impedance value or a higher voltage level, and if the voltage on the bit line bar BLB is high, the first NMOS transistor 372 is biased on or conducting and the read output port 378 provides a lower voltage level, such as ground. In the read operation, the first read circuit 302 and the second read circuit 370 provide differential output voltages, such that one of the read output ports 356 and 378 provides a higher voltage and the other a lower voltage.

Using the first and second read circuits 302 and 370, the sense amplifier voltages on the bit line BL and the bit line bar BLB, which correspond to the sensed voltages from the memory cells are not disturbed or changed during the read operation. Also, using the read circuits 302 and 370 increases the speed of reading the memory cells, where the sense amplifier voltages are not transferred to a secondary SA to be output. Instead, the sense amplifier voltages are read by the first and second read circuits 302 and 370 and corresponding output voltages are provided by the first and second read circuits 302 and 370 at the read output ports 356 and 378.

Figure 9:
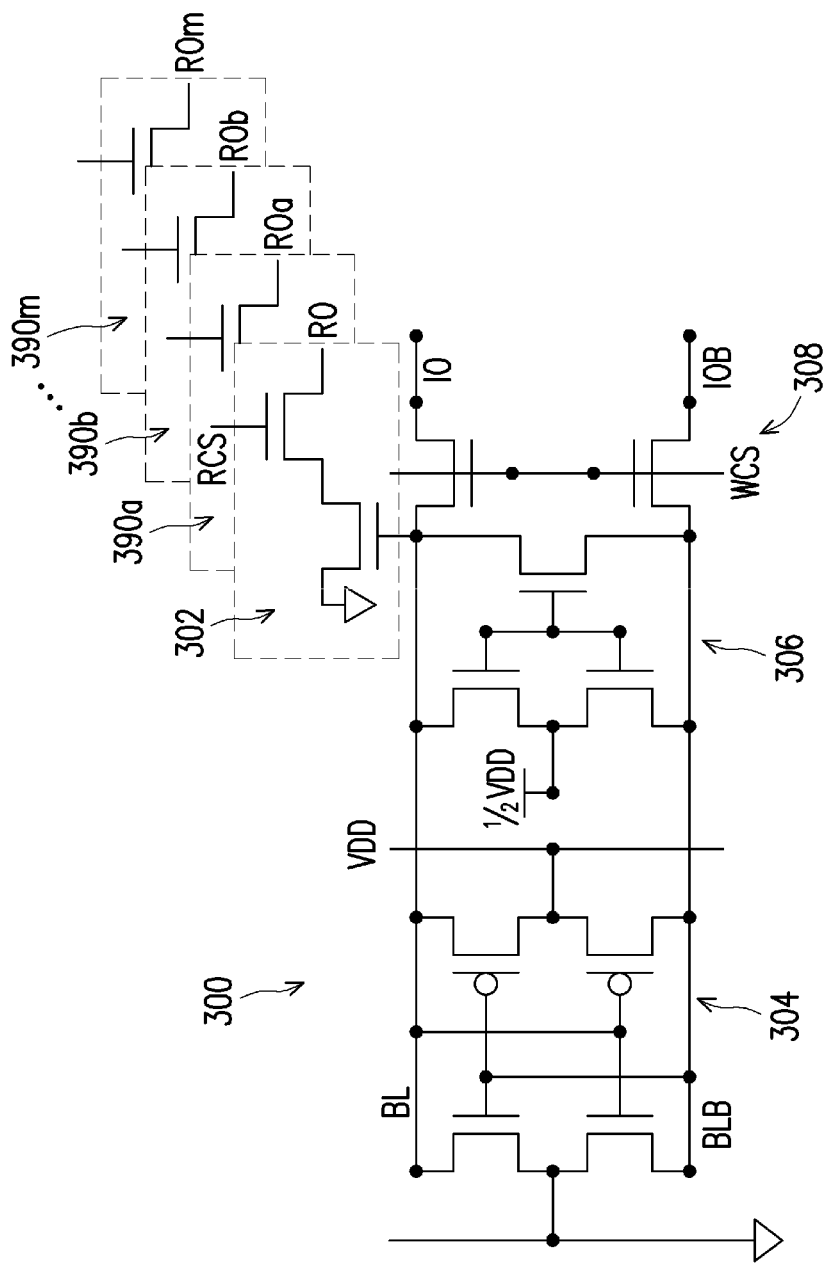
FIG. 9 is a diagram schematically illustrating the SA and the read circuit and a plurality of other read circuits, in accordance with some embodiments.

FIG. 9 is a diagram schematically illustrating the SA 300 and the read circuit 302 and a plurality of other read circuits 390a, 390b, . . . 390m, in accordance with some embodiments. The SA 300 and the read circuit 302 are the same as the SA 300 and the read circuit 302 of FIG. 6, and their description will not be repeated here. Also, each of the plurality of read circuits 390a, 390b, . . . 390m is like the read circuit 302, and that description will not be repeated here.

In read operations, as described above, the read circuit 302 and each of the plurality of read circuits 390a, 390b, . . . 390m provides a read output RO and ROa-ROm, such that the read circuit 302 and the plurality of read circuits 390a, 390b, . . . 390m provide read outputs RO and ROa-ROm. In some embodiments, the read circuit 302 and each of the plurality of read circuits 390a, 390b, . . . 390m is electrically coupled to the SA 300 to sequentially provide the read outputs RO and ROa-ROm. In some embodiments, the read circuit 302 is electrically connected to the SA 300 and each of the plurality of read circuit 390a, 390b, . . . 390m is electrically coupled to another SA (not shown) that is like SA 300, such that the read circuit 302 and the plurality of read circuits 390a, 390b, . . . 390m can simultaneously provide the read outputs RO and ROa-ROm.

Thus, many memory cells can be read by the SA 300, the read circuit 302, and the plurality of read circuits 390a, 390b, . . . 390m and, in some embodiments, many memory cells can be read simultaneously by multiple SAs, including SA 300, the read circuit 302, and the plurality of read circuits 390a, 390b, . . . 390m.

Figure 10A:
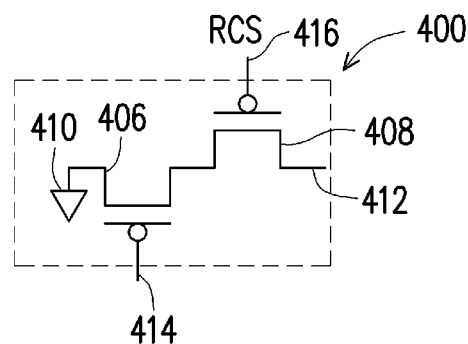
FIG. 10A is a diagram schematically illustrating the read circuit that includes a first PMOS transistor and a second PMOS transistor, in accordance with some embodiments.
Figure 10B:
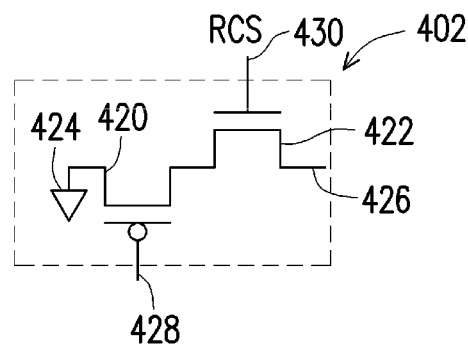
FIG. 10B is a diagram schematically illustrating the read circuit that includes a PMOS transistor and an NMOS transistor, in accordance with some embodiments.
Figure 10C:
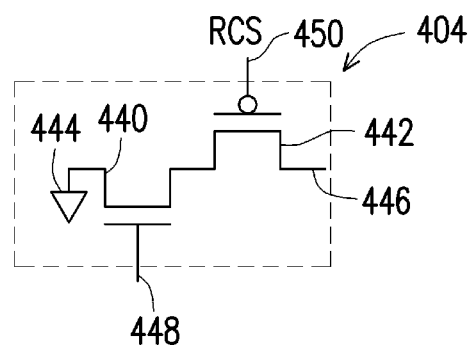
FIG. 10C is a diagram schematically illustrating the read circuit that includes an NMOS transistor and a PMOS transistor, in accordance with some embodiments.

FIGS. 10A-10C are diagrams schematically illustrating read circuits 400, 402, and 404, which include different types of transistors than read circuit 302, in accordance with some embodiments. Each of the read circuits 400, 402, and 404 can replace the read circuit 302.

FIG. 10A is a diagram schematically illustrating the read circuit 400 that includes a first PMOS transistor 406 and a second PMOS transistor 408, in accordance with some embodiments. The read circuit 400 is connected to the SA 300 for reading sense amplifier voltages that correspond to voltages sensed from memory cells, such as memory cells 200, of the memory array, such as memory array 100, by the SA 300.

The read circuit 400 includes the first PMOS transistor 406 and the second PMOS transistor 408. One side of the drain/source path of the first PMOS transistor 406 is connected to a reference 410, such as ground, and the other side of the drain/source path of the first PMOS transistor 406 is connected to one side of the drain/source path of the second PMOS transistor 408. The other side of the drain/source path of the second PMOS transistor 408 provides a read output port 412. The gate at 414 of the first PMOS transistor 406 is connected to one of the bit line BL and the bit line bar BLB to sense the sense amplifier voltage on the bit line BL or the bit line bar BLB, and the gate at 416 of the second PMOS transistor 408 is connected to a read input RCS to receive the RCS signal.

A read path through the drain/source paths of the first and second PMOS transistors 406 and 408 is activated by a low voltage RCS signal received by the read input RCS for reading the sense amplifier voltages during a read operation. Where the read operation is like the read operations described above, with the exception that a high voltage on the gate at 414 from the connected bit line BL or bit line bar BLB biases off or toward not conducting the first PMOS transistor 406 to provide a high impedance or a high voltage at the read output port 412, and a low voltage on the gate at 414 from the connected bit line BL or bit line bar BLB biases on or toward conducting the first PMOS transistor 406 to provide a low voltage, such as ground, at the read output port 412.

FIG. 10B is a diagram schematically illustrating the read circuit 402 that includes a PMOS transistor 420 and an NMOS transistor 422, in accordance with some embodiments. The read circuit 402 is connected to the SA 300 for reading sense amplifier voltages that correspond to voltages sensed from memory cells, such as memory cells 200, of the memory array, such as memory array 100, by the SA 300.

The read circuit 402 includes the PMOS transistor 420 and the NMOS transistor 422. One side of the drain/source path of the PMOS transistor 420 is connected to a reference 424, such as ground, and the other side of the drain/source path of the PMOS transistor 420 is connected to one side of the drain/source path of the NMOS transistor 422. The other side of the drain/source path of the NMOS transistor 422 provides a read output port 426. The gate at 428 of the PMOS transistor 420 is connected to one of the bit line BL and the bit line bar BLB to sense the sense amplifier voltage on the bit line BL or the bit line bar BLB, and the gate at 430 of the NMOS transistor 422 is connected to a read input RCS to receive the RCS signal.

A read path through the drain/source paths of the PMOS transistor 420 and the NMOS transistor 422 is activated by a high voltage RCS signal received by the RCS input at 430 for reading the sense amplifier voltages during a read operation. Where the read operation is like the read operations described above, with the exception that a high voltage on the gate at 428 from the connected bit line BL or bit line bar BLB biases off or toward not conducting the PMOS transistor 420 to provide a high impedance or a high voltage at the read output port 426, and a low voltage on the gate at 428 from the connected bit line BL or bit line bar BLB biases on or toward conducting the PMOS transistor 420 to provide a low voltage, such as ground, at the read output port 426.

FIG. 10C is a diagram schematically illustrating the read circuit 404 that includes an NMOS transistor 440 and a PMOS transistor 442, in accordance with some embodiments. The read circuit 404 is connected to the SA 300 for reading sense amplifier voltages that correspond to voltages sensed from memory cells, such as memory cells 200, of the memory array, such as memory array 100, by the SA 300.

The read circuit 404 includes the NMOS transistor 440 and the PMOS transistor 442. One side of the drain/source path of the NMOS transistor 440 is connected to a reference 444, such as ground, and the other side of the drain/source path of the NMOS transistor 440 is connected to one side of the drain/source path of the PMOS transistor 442. The other side of the drain/source path of the PMOS transistor 442 provides a read output port 446. The gate at 448 of the NMOS transistor 440 is connected to one of the bit line BL and the bit line bar BLB to sense the sense amplifier voltage on the bit line BL or the bit line bar BLB, and the gate at 450 of the PMOS transistor 442 is connected to a read input RCS to receive the RCS signal.

A read path through the drain/source paths of the NMOS transistor 440 and the PMOS transistor 442 is activated by a high voltage RCS signal received by the read input RCS for reading the sense amplifier voltages during a read operation. Where the read operation is like the read operations described above, such that a low voltage on the gate at 448 from the connected bit line BL or bit line bar BLB biases off or toward not conducting the NMOS transistor 440 to provide a high impedance or a high voltage at the read output port 446, and a high voltage on the gate at 448 from the connected bit line BL or bit line bar BLB biases on or toward conducting the NMOS transistor 440 to provide a low voltage, such as ground, at the read output port 446.

Figure 11:
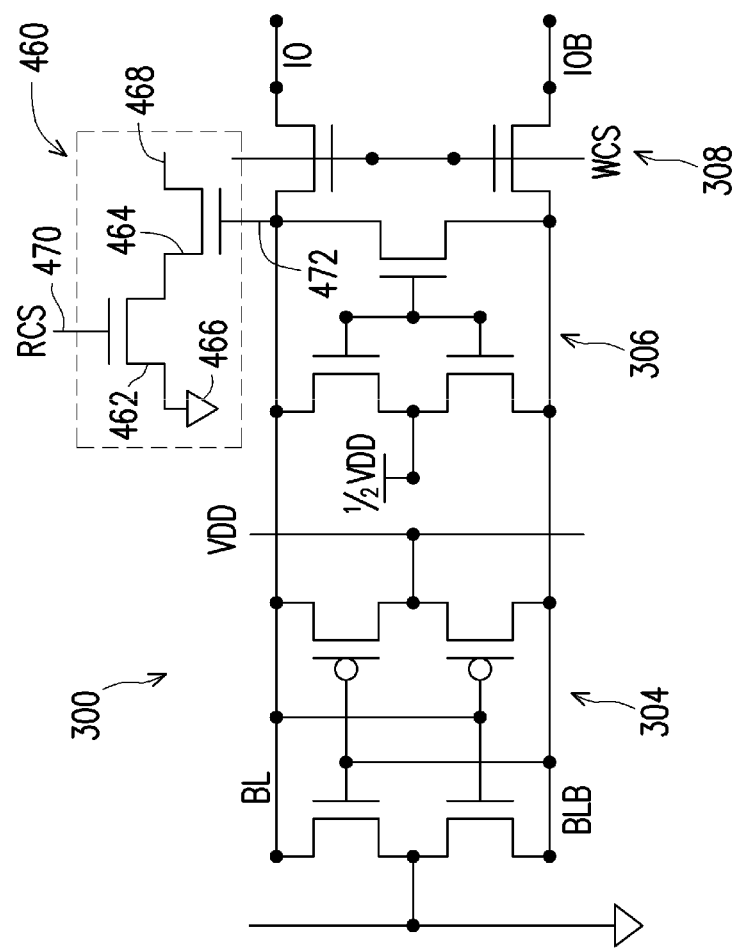
FIG. 11 is a diagram schematically illustrating a read circuit electrically connected to the SA, in accordance with some embodiments.

FIG. 11 is a diagram schematically illustrating a read circuit 460 electrically connected to the SA 300, in accordance with some embodiments. The read circuit 460 is an alternative embodiment of the read circuit 302. The SA 300 is like the SA 300 shown in FIG. 6 and the description of the SA 300 will not be repeated here.

The read circuit 460 is connected to the SA 300 for reading sense amplifier voltages that correspond to voltages sensed from memory cells, such as memory cells 200, of the memory array, such as memory array 100, by the SA 300. The read circuit 460 includes a first NMOS transistor 462 and a second NMOS transistor 464. One side of the drain/source path of the first NMOS transistor 462 is connected to a reference 466, such as ground, and the other side of the drain/source path of the first NMOS transistor 462 is connected to one side of the drain/source path of the second NMOS transistor 464. The other side of the drain/source path of the second NMOS transistor 464 provides a read output port 468. The gate at 470 of the first NMOS transistor 462 is connected to a read input RCS to receive the RCS signal and the gate at 472 of the second NMOS transistor 464 is connected to the bit line BL to sense the sense amplifier voltage on the bit line BL.

A read path through the drain/source paths of the first and second NMOS transistors 462 and 464 is activated by a high voltage RCS signal received by the read input RCS for reading the sense amplifier voltages during a read operation. Where the read operation is like the read operations described above, with the exception that a low voltage on the gate at 472 from the connected bit line BL biases off or toward not conducting the second NMOS transistor 464 to provide a high impedance or a high voltage at the read output port 468, and a high voltage on the gate at 472 from the connected bit line BL biases on or toward conducting the second NMOS transistor 464 to provide a low voltage, such as ground, at the read output port 468.

The read circuit 460 includes two NMOS transistors, however, in other embodiments, the read circuit 460 can instead include two PMOS transistors or one PMOS transistor and one NMOS transistor. Of course, the voltage for activating the read path and the voltage for biasing the transistor connected to the SA 300 change according to the type of transistor (NMOS or PMOS) connected to the SA 300.

Figure 12:
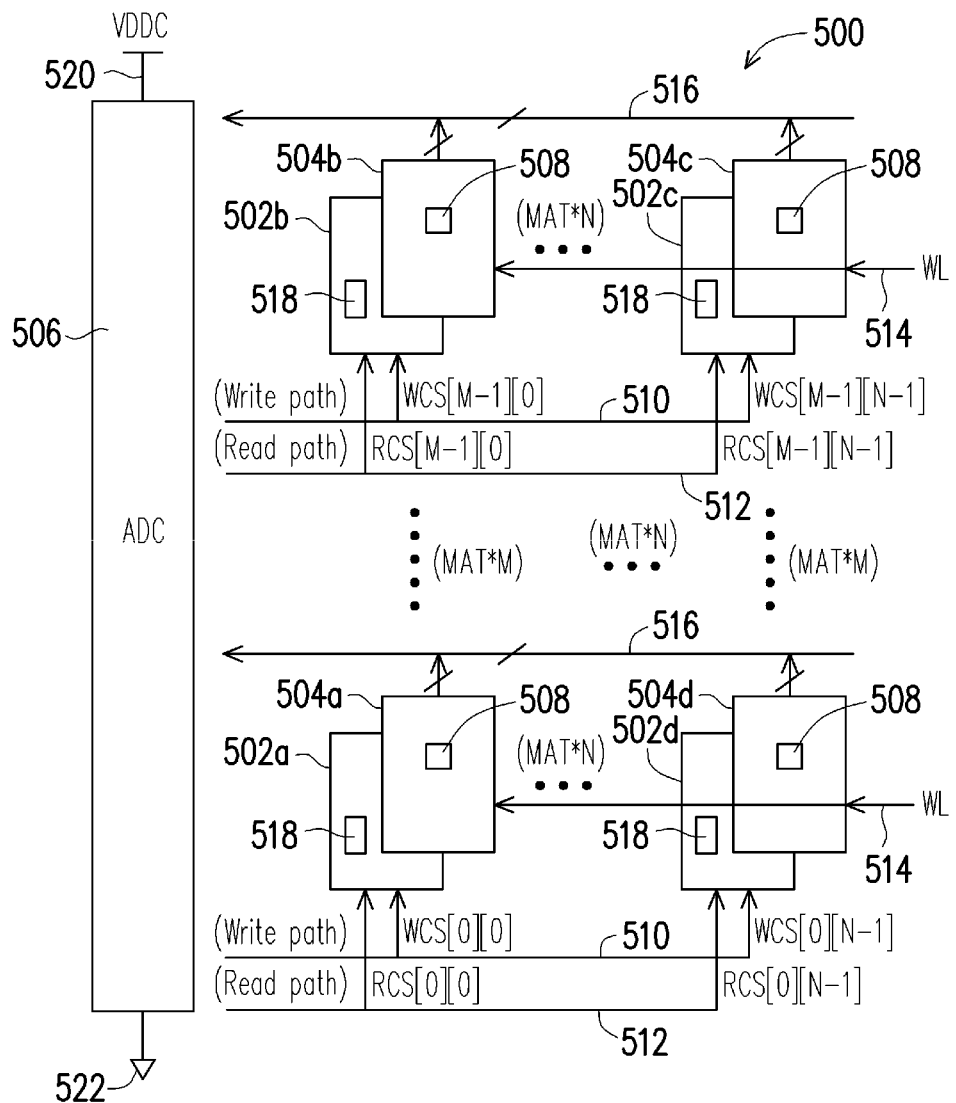
FIG. 12 is a diagram schematically illustrating an example of a CIM memory device that includes CIM circuits electrically coupled to memory array MATs and an ADC in the CIM memory device, in accordance with some embodiments.

FIG. 12 is a diagram schematically illustrating an example of a CIM memory device 500 that includes CIM circuits 502a-502d electrically coupled to memory array MATs 504a-504d and an ADC 506 in the CIM memory device 500, in accordance with some embodiments. Each of the CIM circuits 502a-502d is electrically coupled to memory cells 508 in a corresponding one of the memory array MATs 504a-504d, respectively. In some embodiments, the CIM memory device 500 is like the memory device 20 of FIG. 1.

The CIM circuits 502a-502d are arranged in rows and columns, with each row having N number of CIM circuits 502a-502d and each column having M number of CIM circuits 502a-502d. Also, each of the CIM circuits 502a-502d is configured to receive a write column select (WCS) signal 510 and a read column select (RCS) signal 512 for writing and reading memory cells 508 in the corresponding memory array MAT of the memory array MATs 504a-504d.

The memory array MATs 504a-504d are arranged in rows and columns, with each row having N number of MATS and each column having M number of MATs. Each row of memory array MATs 504a-504d is configured to receive a word line WL 514 for accessing memory cells 508 during read and write operations, and each of the memory array MATs 504a-504d is electrically connected to other circuits by data lines or data buses 516.

The CIM circuits 502a-502d are configured to provide memory control and SA functions for reading and writing the memory cells 508 and functions for CIM applications, such as CNN applications. In some embodiments, the CIM circuits 502a-502d include one or more SA circuits 518 that include a memory control circuit, at least one SA, and at least one read circuit for reading and writing the memory cells 508. In some embodiments, the CIM circuits 502a-502d are FEOL circuits situated underneath the memory array MATs 504a-504 that are BEOL circuits.

The ADC 506 is configured to provide analog-to-digital conversions and is electrically connected to the CIM circuits 502a-502d to receive data from and/or provide data to the CIM circuits 502a-502d. In some embodiments, the ADC 506 is a FEOL circuit. In some embodiments, the ADC 506 is situated next to or underneath the memory array MATs 504a-504d.

The CIM memory device 500, including the CIM circuits 502a-502d, the memory array MATs 504a-504d, and the ADC 506, is connected between a power terminal 520 configured to receive a VDDC voltage and a reference terminal 522, such as a ground terminal. Each of the memory array MATs 504a-504d includes memory cells 508 arranged in rows and columns. The CIM memory device 500 further includes row and column decoders and select circuits (not shown) that are connected to the CIM circuits 502a-502d and the memory array MATs 504a-504d and that receive row and column addresses to select memory cells 508 in the rows and columns of the memory array MATs 504a-504d during read and write operations. In some embodiments, the memory array MATs 504a-504d include BEOL 1 transistor memory cells, such as flash memory cells. In some embodiments, the memory array MATs 504a-504d are three-dimensional (3D) BEOL memory arrays situated above the CIM circuits 502a-502d that are FEOL circuits. In some embodiments, the memory array MATs 504a-504d include a plurality of memory cells 508 that store CIM weight signals for a CNN.

The CIM circuits 502a-502d include the SA circuits 518 that include read circuits, similar to the read circuits 302, 400, 402, and 404 described above, attached to SAs in the SA circuits 518. In this configuration, the memory array MATs 504a-504d are not restricted to a single data bus and multiple MATs can be written and read at the same time. For example, data can be written to a first MAT of the memory array MATs 504a-504d in time t1, and data can be read from the second to sixth MAT of the memory array MATS 504a-504d in the time of t2+t3+t4+t5+t6. If the write time is the same as the sum of the read times, i.e., t1=t2+t3+t4+t5+t6, the write operation of the first MAT and the read operations of the second to sixth MATs can be performed at the same time, i.e., simultaneously.

Figure 13:
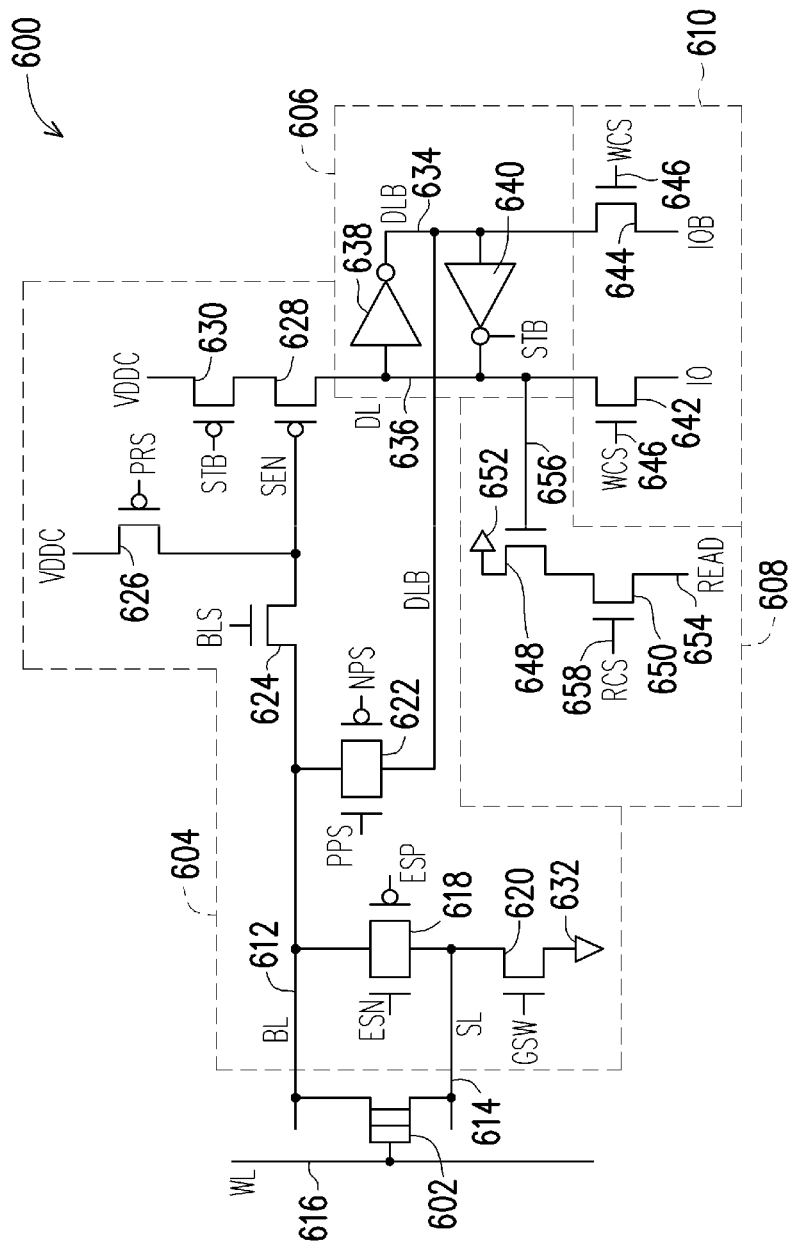
FIG. 13 is a diagram schematically illustrating a SA circuit that is electrically connected to a memory cell, in accordance with some embodiments.

FIG. 13 is a diagram schematically illustrating a SA circuit 600 that is electrically connected to a memory cell 602, in accordance with some embodiments. In this example, the memory cell 602 is a 1 transistor memory cell. In some embodiments, the SA circuit 600 is like the SA circuit 518 (shown in FIG. 12). In some embodiments, the memory cell 602 is like the memory cell 508 (shown in FIG. 12). In some embodiments, the memory cell 602 is a flash memory cell.

The SA circuit 600 includes a control circuit 604, a SA 606, a read circuit 608, and an IO write circuit 610. The read circuit 608 is electrically connected to the SA 606 for reading sense amplifier voltages that correspond to voltages sensed by the SA 606 from the memory cell 602. In some embodiments, the SA 606 is like the SA 30 (shown in FIGS. 1 and 2). In some embodiments, the SA 606 is like the SA 122 (shown in FIG. 4). In some embodiments, the read circuit 608 is like the read circuit 34 (shown in FIGS. 1 and 2). In some embodiments, the read circuit 608 is like the read circuit 302 (shown in FIG. 4). In some embodiments, the read circuit 608 is part of the SA 606. In some embodiments, the read circuit 606 is a separate circuit electrically connected to the SA 606.

In this example, the SA circuit 600 includes NMOS transistors and PMOS transistors in one configuration. Of course, it is to be understood that in other embodiments, the SA circuit 600 can include NMOS transistors and PMOS transistors in another configuration. For example, in other embodiments, at least some of the NMOS transistors and the PMOS transistors of the current configuration can be switched.

The control circuit 604 is electrically coupled to the memory cell 602. One drain/source region of the memory cell 602 is electrically coupled to the bit line BL 612 of the control circuit 604 and another drain/source region of the memory cell 602 is electrically coupled to the source line SL 614 of the control circuit 604. The gate of the memory cell 602 is electrically connected to the word line WL 616. In some embodiments, the word line 616 is like the word line WL 514 (shown in FIG. 12).

The control circuit 604 includes a first transmission gate 618, a first NMOS transistor 620, a second transmission gate 622, a second NMOS transistor 624, a first PMOS transistor 626, a second PMOS transistor 628, and a third PMOS transistor 630. The first transmission gate 618 is electrically connected on one side to the bit line BL 612 and on another side to the source line SL 614 and a drain/source region of the first NMOS transistor 620. The other drain/source region of the first NMOS transistor 620 is electrically coupled to a reference 632, such as ground. The second transmission gate 622 is electrically connected on one side to the bit line BL 612 and on another side to a data line bar DLB 634 of the SA 606. The second NMOS transistor 624 is electrically connected on one side to the bit line BL 612 and on another side to a drain source region of the first PMOS transistor 626 and the gate of the second PMOS transistor 628. The other side of the first PMOS transistor 626 is electrically coupled to receive a power supply voltage VDDC, such as at the power terminal 520 (shown in FIG. 12). One drain/source region of the second PMOS transistor 628 is electrically connected to a data line DL 636 of the SA 606, and the other drain/source region of the second PMOS transistor 628 is electrically connected to one drain/source region of the third PMOS transistor 630 and the other drain/source region of the third PMOS transistor 630 is electrically coupled to receive the power supply voltage VDDC, such as at the power supply terminal 520.

The SA 606 includes two cross-coupled inverters, a first inverter 638 and a second inverter 640. The input of the first inverter 638 is electrically connected to the output of the second inverter 640 and to the read circuit 608 and to the IO write circuit 610 by the data line DL 636. The output of the first inverter 638 is electrically connected to the input of the second inverter 640 and to the IO write circuit 610 by the data line bar DLB 634. This results in positive feedback that stabilizes one of the data line DL 636 and the data line bar DLB 634 at a high voltage and the other one of the data line DL 636 and the data line bar DLB 634 at a low voltage. In some embodiments, the second inverter 640 includes an input for receiving an input signal STB.

The IO write circuit 610 includes a third NMOS transistor 642 and a fourth NMOS transistor 644. The third NMOS transistor 642 has a drain/source path connected in series with the data line DL 636 and an IO line. The fourth NMOS transistor 644 has a drain/source path connected in series with the data line bar DLB 634 and an IOB line. The gates 646 of the third and fourth NMOS transistors 642 and 644 are write input configured to receive a write column select signal WCS for writing the memory cell 602 during a write operation.

In a write operation, the WCS signal is set to a high voltage to turn on the third and fourth NMOS transistors 642 and 644. Selected voltages are provided to the IO line and the IOB line at the drain source paths of the third and fourth NMOS transistors 642 and 644, respectively. This drives the data line DL 636 and the data line bar DLB 634 to the selected voltages. The control circuit 604 including the first transmission gate 618, the first NMOS transistor 620, the second transmission gate 622, the second NMOS transistor 624, the first PMOS transistor 626, the second PMOS transistor 628, and the third PMOS transistor 630 are controlled to set (or program) and erase the memory cell 602 to a high or a low state representing a 1 or a 0, respectively.

The read circuit 608 is electrically connected to the SA 606 for reading sense amplifier voltages that correspond to voltages sensed from the memory cell 602. The read circuit 606 includes a fifth NMOS transistor 648 and a sixth NMOS transistor 650. One side of the drain/source path of the fifth NMOS transistor 648 is electrically connected to a reference 652, such as ground, and the other side of the drain/source path of the fifth NMOS transistor 648 is electrically connected to one side of the drain/source path of the sixth NMOS transistor 650. The other side of the drain/source path of the sixth NMOS transistor 650 provides a read output port 654. The gate 656 of the fifth NMOS transistor 648 is connected to the data line DL 636 to sense the sense amplifier voltage on the data line DL 636 and the gate 658 of the sixth NMOS transistor 650 is connected to a read input to receive the RCS signal. A read path through the drain/source paths of the fifth and sixth NMOS transistors 648 and 650 is activated by a high voltage RCS signal at the read input for reading the sense amplifier voltages during a read operation. The read input and the RCS signal are separate from the write input and the WCS signal, such that the RCS read function and the WCS write function are decoupled from one another.

In a read operation, word lines and bit lines are selected based on an address received by the row and column address and select circuits. The word line WL 616 is driven to access the data stored in the memory cell 602. The control circuit 604 including the first transmission gate 618, the first NMOS transistor 620, the second transmission gate 622, the second NMOS transistor 624, the first PMOS transistor 626, the second PMOS transistor 628, and the third PMOS transistor 630 are controlled to read the state of the memory cell 602, which sets the voltage on the bit line BL 612 to a high or low voltage based on the data stored in the memory cell 602. The state of the memory cell 602 is transferred from the bit line BL 612 to the data line DL 636 and the data line bar DLB 634.

The SA 606 receives the voltages on the data line DL 636 and the data line bar DLB 634 and locks-in the voltage difference in the cross-coupled inverters 638 and 640. A high voltage RCS signal is received at the read input to activate the read path through the drain/source paths of the fifth NMOS transistor 648 and sixth NMOS transistor 650. If the voltage on the data line DL 636 is low, the fifth NMOS transistor 648 is biased off or toward non-conducting and the read output port 654 provides a high impedance value or a high voltage level. If the voltage on the data line DL 636 is high, the fifth NMOS transistor 648 is biased on or conducting and the read output port 654 provides a low voltage level, such as ground.

Using the read circuit 608, the sense amplifier voltages on the data line DL 636 and the data line bar DLB 634, which correspond to the sensed voltage from the memory cell 602, are not disturbed or changed during the read operation. Also, using the read circuit 608 increases the speed of reading the memory cells, where the sense amplifier voltages are not transferred to a secondary SA to be output. Instead, the sense amplifier voltages are read by the read circuit 608 and corresponding output voltages are provided by the read circuit 608 at the read output port 654.

In some embodiments, the SA 606 voltages are read by the read circuit 608 and the read output port 654 provides output voltages that correspond to the SA 606 voltages directly to an ADC, such as the ADC 506 (shown in FIG. 12). In some embodiments, the SA 606 voltages are read by the read circuit 608 and the read output port 654 provides output voltages that correspond to the SA 606 voltages directly to the ADC and the ADC provides outputs directly to other CIM circuits. In some embodiments, the SA 606 voltages are read by the read circuit 608 and the read output port 654 provides output voltages that correspond to the SA 606 voltages directly to other CIM circuits.

Figure 14:
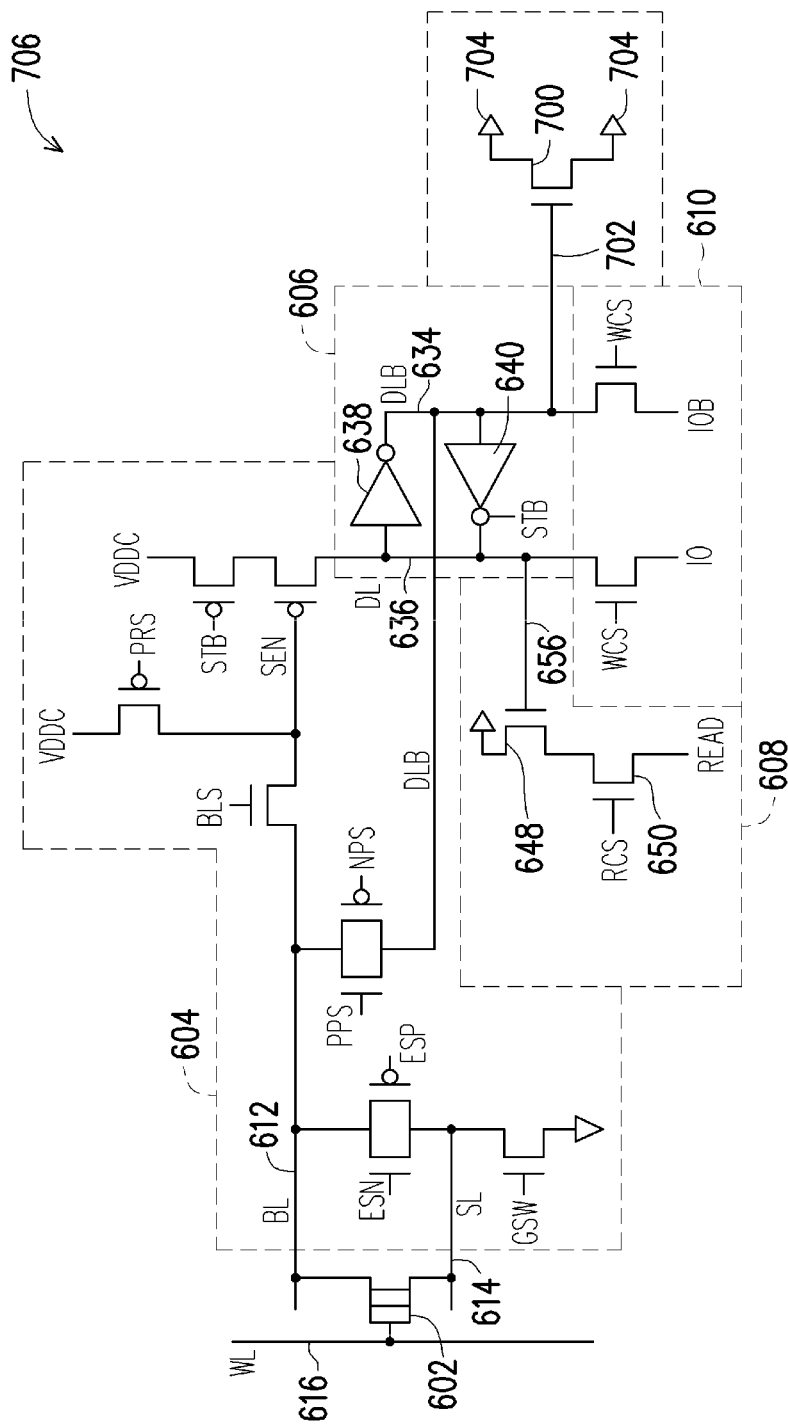
FIG. 14 is a diagram schematically illustrating a SA circuit that includes a load balancing NMOS transistor electrically connected to the SA, in accordance with some embodiments.

FIG. 14 is a diagram schematically illustrating a SA circuit 706 including a load balancing NMOS transistor 700 electrically connected to the SA 606, in accordance with some embodiments. The memory cell 602, control circuit 604, SA 606, read circuit 608, and IO write circuit 610 are like the memory cell 602, control circuit 604, SA 606, read circuit 608, and IO write circuit 610 (shown in FIG. 13), and they will not be described again here.

The load balancing NMOS transistor 700 includes a gate 702 electrically connected to the data line bar DLB 634 of the SA 606. Also, each side of the drain/source path of the NMOS transistor 700 is electrically connected to a reference 704, such as ground.

The gate 656 of the fifth NMOS transistor 648 in the read circuit 608 is connected to the data line DL 636 to sense the SA 606 voltages on the data line DL 636. The gate 656 provides at least a load capacitance on the data line DL 636, such that charging and discharging of the data line DL 636 and the connected gate 656 is different from charging and discharging of the data line bar DLB 634 without a connected gate. This incongruity results in an imbalance in the voltages on the data line DL 636 and the data line bar DLB 634, which could result in inaccurately sensing the voltages from the memory cell 602. By connecting the gate 702 of the NMOS transistor 700 to the data line bar DLB 634, the loads including the capacitive loads on each of the data line DL 636 and the data line bar DLB 634 are more evenly balanced, i.e., more closely the same, which improves the sensing of the voltages from the memory cell 602 by the SA 606.

Figure 15:
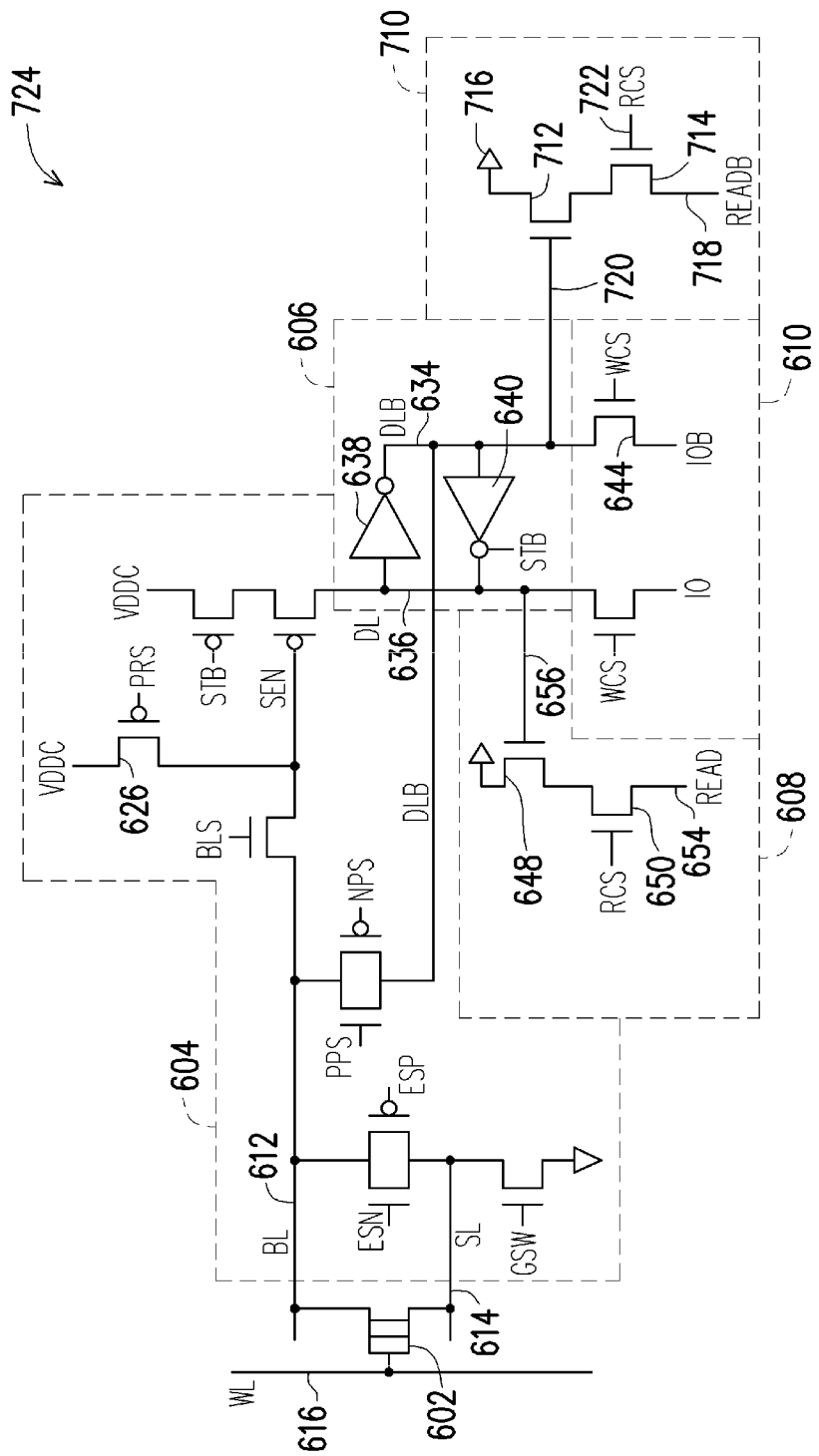
FIG. 15 is a diagram schematically illustrating a SA circuit that includes a second read circuit electrically connected to the SA, in accordance with some embodiments.

FIG. 15 is a diagram schematically illustrating a SA circuit 724 including a second read circuit 710 electrically connected to the SA 606, in accordance with some embodiments. In a read operation, the SA 606, the first read circuit 608, and the second read circuit 710 provide differential output voltages, such that one of the outputs from the read circuits 608 and 710 is a higher voltage and the other is a lower voltage. The memory cell 602, control circuit 604, SA 606, read circuit 608, and IO write circuit 610 are like the memory cell 602, control circuit 604, SA 606, read circuit 608, and IO write circuit 610 (shown in FIG. 13), and they will not be described again here.

The second read circuit 710 is connected to the SA 606 for reading SA 606 voltages that correspond to voltages sensed from the memory cell 602. The second read circuit 710 includes a first NMOS transistor 712 and a second NMOS transistor 714. One side of the drain/source path of the first NMOS transistor 712 is connected to a reference 716, such as ground, and the other side of the drain/source path of the first NMOS transistor 712 is connected to one side of the drain/source path of the second NMOS transistor 714. The other side of the drain/source path of the second NMOS transistor 714 provides a read bar output port 718. The gate 720 of the first NMOS transistor 712 is connected to the data line bar DLB 634 to sense the SA 606 voltage on the data line bar DLB 634. The gate 722 of the second NMOS transistor 714 is connected to a read input to receive the RCS signal. A read path through the drain/source paths of the first and second NMOS transistors 712 and 714 is activated by the RCS signal received by the read input for reading the SA 606 voltages during a read operation. The read inputs and the RCS signal are separate from the write inputs and the WCS signal, such that the RCS read function and the WCS write function are decoupled from one another.

The gate 656 of the first NMOS transistor 648 in the first read circuit 608 is connected to the data line DL 636 to sense the SA 606 voltages on the data line DL 636. The gate 656 provides at least a load capacitance on the data line DL 636, such that charging and discharging of the data line DL 636 and the connected gate 656 is different from charging and discharging of the data line bar DLB without a connected gate. This incongruity results in an imbalance in the voltages on the data line DL 636 and the data line bar DLB 634, which could result in inaccurately sensing the voltages from the memory cell 602. By connecting the gate 720 of the first NMOS transistor 712 to the data line bar DLB 634, the loads including the capacitive loads on each of the data line DL 636 and the data line bar DLB 634 are more evenly balanced, i.e., more closely the same, which improves the sensing of the voltages from the memory cells, such as memory cell 602, by the SA 606.

In a read operation, word lines and bit lines are selected based on an address received by the row and column address and select circuits. The word line WL 616 is driven to access the data stored in the memory cell 602. The control circuit 604 is controlled to read the state of the memory cell 602, which sets the voltage on the bit line BL 612 to a high or low voltage based on the data stored in the memory cell 602. The state of the memory cell 602 is transferred from the bit line BL 612 to the data line DL 636 and the data line bar DLB 634.

The SA 606 receives the voltages on the data line DL 636 and the data line bar DLB 634 and locks-in the voltage difference in the cross-coupled inverters 638 and 640. A high voltage RCS signal is received at the read inputs to activate the read paths in the first read circuit 608 through the drain/source paths of the fifth NMOS transistor 648 and the sixth NMOS transistor 650 and to activate the read path in the second read circuit 710 through the drain/source paths of the first and second NMOS transistors 712 and 714. In the first read circuit 608, if the voltage on the data line DL 636 is low, the fifth NMOS transistor 648 is biased off or toward non-conducting and the read output port 654 provides a high impedance value or a higher voltage level, and if the voltage on the data line DL 636 is high, the fifth NMOS transistor 648 is biased on or conducting and the read output port 654 provides a lower voltage level, such as ground. In the second read circuit 710, if the voltage on the data line bar DLB 634 is low, the first NMOS transistor 712 is biased off or toward non-conducting and the read bar output port 718 provides a high impedance value or a higher voltage level, and if the voltage on the data line bar DLB 634 is high, the first NMOS transistor 712 is biased on or conducting and the read bar output port 718 provides a lower voltage level, such as ground. In the read operation, the first read circuit 608 and the second read circuit 710 provide differential output voltages, such that one of the read and read bar output ports 654 and 718 provides a higher voltage and the other a lower voltage.

Using the first and second read circuits 608 and 710, the SA 606 voltages on the data line DL 636 and the data line bar DLB 634, which correspond to the sensed voltages from the memory cell 602 are not disturbed or changed during the read operation. Also, using the read circuits 608 and 710 increases the speed of reading the memory cells, such as memory cell 602, where the SA 606 voltages are not transferred to a secondary SA to be output. Instead, the SA 606 voltages are read by the first and second read circuits 608 and 710 and corresponding output voltages are provided by the first and second read circuits 608 and 710 at the read and read bar output ports 654 and 718.

Figure 16:
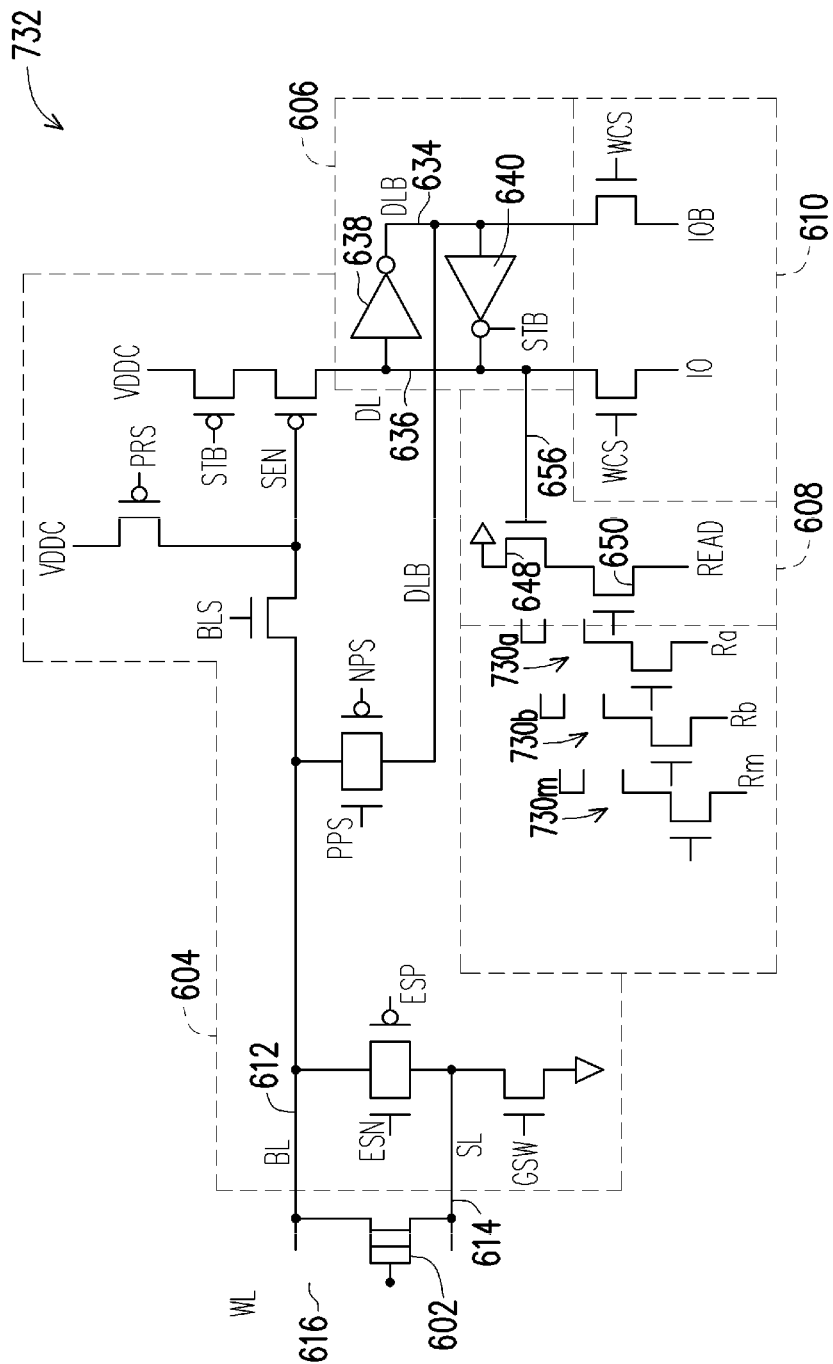
FIG. 16 is a diagram schematically illustrating a SA circuit that includes a SA and a read circuit and a plurality of other read circuits, in accordance with some embodiments.

FIG. 16 is a diagram schematically illustrating a SA circuit 732 including the SA 606 and the read circuit 608 and a plurality of other read circuits 730a, 730b, . . . 730m, in accordance with some embodiments. The memory cell 602, control circuit 604, SA 606, read circuit 608, and IO write circuit 610 are like the memory cell 602, control circuit 604, SA 606, read circuit 608, and IO write circuit 610 (shown in FIG. 13), and they will not be described again here. Also, each of the plurality of read circuits 730a, 730b, . . . 730m is like the read circuit 608, and that description will not be repeated here.

In read operations, as described above, the read circuit 608 and each of the plurality of read circuits 730a, 730b, . . . 730m provides a read output READ, Ra, and Rb to Rm, respectively. In some embodiments, the read circuit 608 and each of the plurality of read circuits 730a, 730b, . . . 730m is electrically coupled to the SA 606 to sequentially provide the read outputs READ, Ra, and Rb to Rm. In some embodiments, the read circuit 608 is electrically connected to the SA 606 and each of the plurality of read circuits 730a, 730b, . . . 730m is electrically coupled to another SA (not shown) that is like SA 606, such that the read circuit 608 and each of the plurality of read circuits 730a, 730b, . . . 730m can simultaneously provide the read outputs READ, Ra, and Rb to Rm.

Thus, many memory cells can be read by the SA 606, the read circuit 608, and the plurality of read circuits 730a, 730b, . . . 730m and, in some embodiments, many memory cells can be read simultaneously by multiple SAs, including SA 606, the read circuit 608, and the plurality of read circuits 730a, 730b, . . . 730m.

Figure 17A:
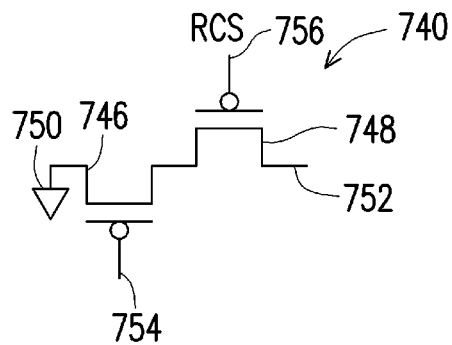
FIG. 17A is a diagram schematically illustrating a read circuit that includes a first PMOS transistor and a second PMOS transistor, in accordance with some embodiments.
Figure 17B:
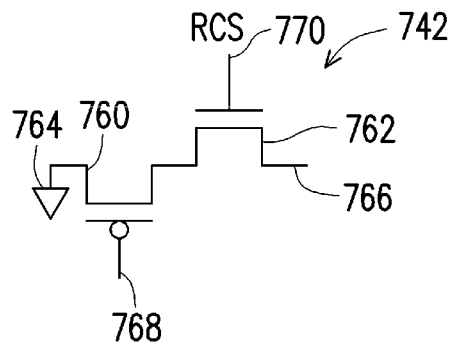
FIG. 17B is a diagram schematically illustrating a read circuit that includes a PMOS transistor and an NMOS transistor, in accordance with some embodiments.
Figure 17C:
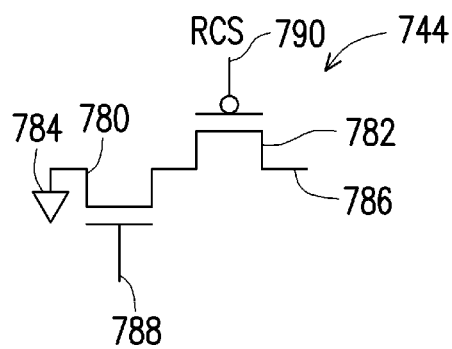
FIG. 17C is a diagram schematically illustrating a read circuit that includes an NMOS transistor and a PMOS transistor, in accordance with some embodiments.

FIGS. 17A-17C are diagrams schematically illustrating read circuits 740, 742, and 744, which include different types of transistors than read circuit 608, in accordance with some embodiments. Each of the read circuits 740, 742, and 744 can replace the read circuit 608.

FIG. 17A is a diagram schematically illustrating the read circuit 740 that includes a first PMOS transistor 746 and a second PMOS transistor 748, in accordance with some embodiments. The read circuit 740 is connected to the SA 606 for reading SA 606 voltages that correspond to voltages sensed from memory cells, such as memory cell 602.

The read circuit 740 includes the first PMOS transistor 746 and the second PMOS transistor 748. One side of the drain/source path of the first PMOS transistor 746 is connected to a reference 750, such as ground, and the other side of the drain/source path of the first PMOS transistor 746 is connected to one side of the drain/source path of the second PMOS transistor 748. The other side of the drain/source path of the second PMOS transistor 748 provides a read output port 752. The gate at 754 of the first PMOS transistor 746 is connected to one of the data line DL 636 and the data line bar DLB 634 to sense the SA 606 voltage on the data line DL 636 and the data line bar DLB 634, and the gate at 756 of the second PMOS transistor 748 is connected to a read input to receive the RCS signal.

A read path through the drain/source paths of the first and second PMOS transistors 746 and 748 is activated by a low voltage RCS signal received by the read input for reading the SA 606 voltages during a read operation. Where the read operation is like the read operations described above, with the exception that a high voltage on the gate 754 from the connected data line DL 636 or data line bar DLB 634 biases off or toward not conducting the first PMOS transistor 746 to provide a high impedance or a high voltage at the read output port 752, and a low voltage on the gate at 754 from the connected data line DL 636 or data line bar DLB 634 biases on or toward conducting the first PMOS transistor 746 to provide a low voltage, such as ground, at the read output port 752.

FIG. 17B is a diagram schematically illustrating the read circuit 742 that includes a PMOS transistor 760 and an NMOS transistor 762, in accordance with some embodiments. The read circuit 742 is connected to the SA 606 for reading SA 606 voltages that correspond to voltages sensed from memory cells, such as memory cell 602.

The read circuit 742 includes the PMOS transistor 760 and the NMOS transistor 762. One side of the drain/source path of the PMOS transistor 760 is connected to a reference 764, such as ground, and the other side of the drain/source path of the PMOS transistor 760 is connected to one side of the drain/source path of the NMOS transistor 762. The other side of the drain/source path of the NMOS transistor 762 provides a read output port 766. The gate 768 of the PMOS transistor 760 is connected to one of the data line DL 636 and the data line bar DLB 634 to sense the SA 606 voltage on the data line DL 636 or data line bar DLB 634, and the gate 770 of the NMOS transistor 762 is connected to a read input to receive the RCS signal.

A read path through the drain/source paths of the PMOS transistor 760 and the NMOS transistor 762 is activated by a high voltage RCS signal received by the read input 770 for reading the SA 606 voltages during a read operation. Where the read operation is like the read operations described above, with the exception that a high voltage on the gate 768 from the connected data line DL 636 or data line bar DLB 634 biases off or toward not conducting the PMOS transistor 760 to provide a high impedance or a high voltage at the read output port 766, and a low voltage on the gate 768 from the connected data line DL 636 or data line bar DLB 634 biases on or toward conducting the PMOS transistor 760 to provide a low voltage, such as ground, at the read output port 766.

FIG. 17C is a diagram schematically illustrating the read circuit 744 that includes an NMOS transistor 780 and a PMOS transistor 782, in accordance with some embodiments. The read circuit 744 is connected to the SA 606 for reading SA 606 voltages that correspond to voltages sensed from memory cells, such as memory cell 602.

The read circuit 744 includes the NMOS transistor 780 and the PMOS transistor 782. One side of the drain/source path of the NMOS transistor 780 is connected to a reference 784, such as ground, and the other side of the drain/source path of the NMOS transistor 780 is connected to one side of the drain/source path of the PMOS transistor 782. The other side of the drain/source path of the PMOS transistor 782 provides a read output port 786. The gate 788 of the NMOS transistor 780 is connected to one of the data line DL 636 and data line bar DLB 634 to sense the SA 606 voltage on the data line DL 636 or data line bar DLB 634, and the gate 790 of the PMOS transistor 782 is connected to a read input to receive the RCS signal.

A read path through the drain/source paths of the NMOS transistor 780 and the PMOS transistor 782 is activated by a high voltage RCS signal received by the read input for reading the SA 606 voltages during a read operation. Where the read operation is like the read operations described above, such that a low voltage on the gate 788 from the connected data line DL 636 or data line bar DLB 634 biases off or toward not conducting the NMOS transistor 780 to provide a high impedance or a high voltage at the read output port 786, and a high voltage on the gate 788 from the connected data line DL 636 or data line bar DLB 634 biases on or toward conducting the NMOS transistor 780 to provide a low voltage, such as ground, at the read output port 786.

Figure 18:
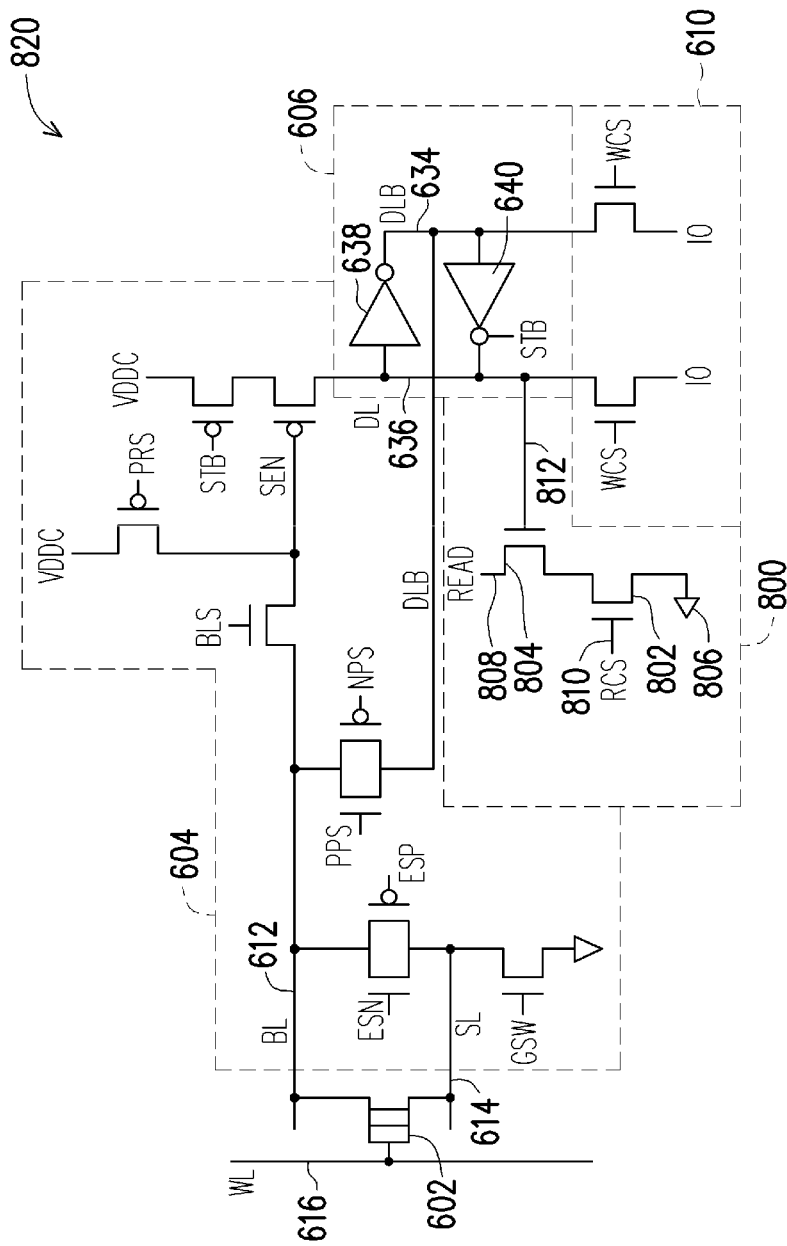
FIG. 18 is a diagram schematically illustrating a SA circuit that includes a read circuit electrically connected to the SA, in accordance with some embodiments.

FIG. 18 is a diagram schematically illustrating a SA circuit 820 including a read circuit 800 electrically connected to the SA 606, in accordance with some embodiments. The read circuit 800 is an alternative embodiment of the read circuit 608. The memory cell 602, control circuit 604, SA 606, and IO write circuit 610 are like the memory cell 602, control circuit 604, SA 606, and IO write circuit 610 (shown in FIG. 13), and they will not be described again here.

The read circuit 800 is connected to the SA 606 for reading SA 606 voltages that correspond to voltages sensed from memory cells, such as memory cell 602. The read circuit 800 includes a first NMOS transistor 802 and a second NMOS transistor 804. One side of the drain/source path of the first NMOS transistor 802 is connected to a reference 806, such as ground, and the other side of the drain/source path of the first NMOS transistor 802 is connected to one side of the drain/source path of the second NMOS transistor 804. The other side of the drain/source path of the second NMOS transistor 804 provides a read output port 808. The gate 810 of the first NMOS transistor 802 is connected to a read input to receive the RCS signal and the gate 812 of the second NMOS transistor 804 is connected to the data line DL 636 to sense the SA 606 voltage on the data line DL 636.

A read path through the drain/source paths of the first and second NMOS transistors 802 and 804 is activated by a high voltage RCS signal received by the read input for reading the SA 606 voltages during a read operation. Where the read operation is like the read operations described above, with the exception that a low voltage on the gate 812 from the connected data line DL 636 biases off or toward not conducting the second NMOS transistor 804 to provide a high impedance or a high voltage at the read output port 808, and a high voltage on the gate 812 from the connected data line DL 636 biases on or toward conducting the second NMOS transistor 804 to provide a low voltage, such as ground, at the read output port 808.

The read circuit 800 includes two NMOS transistors, however, in other embodiments, the read circuit 800 can instead include two PMOS transistors or one PMOS transistor and one NMOS transistor. Of course, the voltage for activating the read path and the voltage for biasing the transistor connected to the SA 606 changes according to the type of transistor (NMOS or PMOS) connected to the SA 606.

Figure 19:
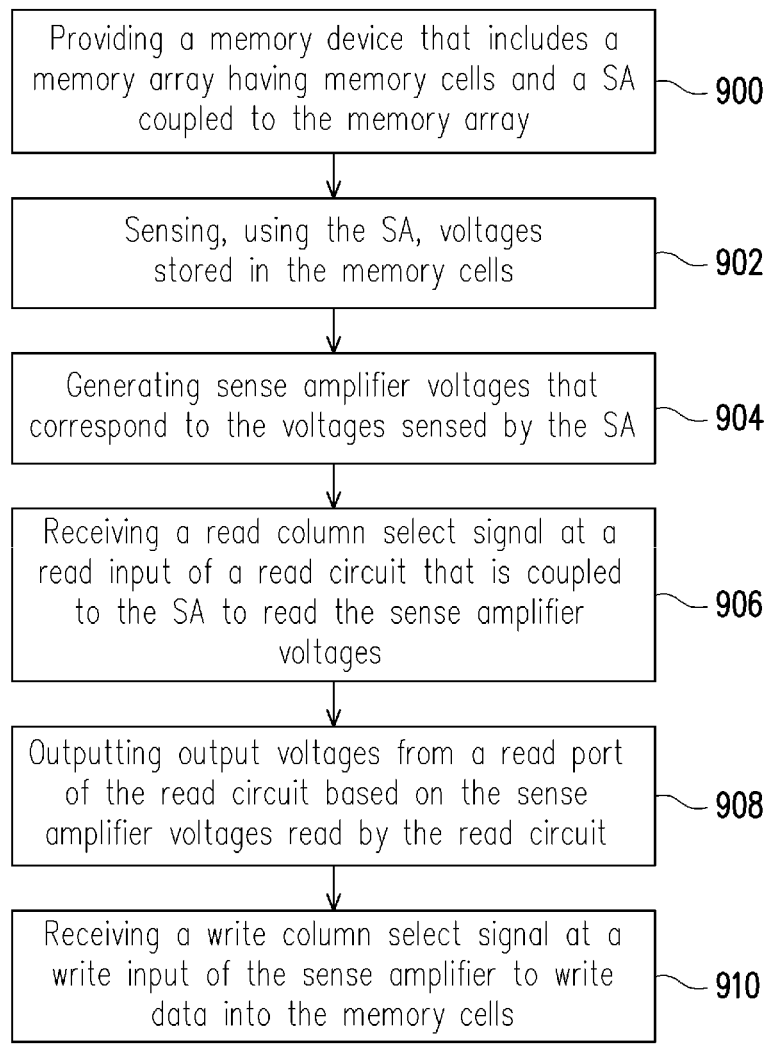
FIG. 19 is a diagram schematically illustrating a method of reading memory cells from a memory array, in accordance with some embodiments.

FIG. 19 is a diagram schematically illustrating a method of reading memory cells from a memory array, in accordance with some embodiments. At 900, the method includes providing a memory device, such as memory device 20, memory device 50, and/or memory device 500, that includes a memory array, such as memory array 22, memory array 100, and/or memory array MATs 504a-504d, having memory cells, such as memory cells 200 and/or memory cells 508, and a SA, such as SA 30, SA 122, SA 300, and/or SA 606 coupled to the memory array. In some embodiments, the memory array is situated above the SA. In some embodiments, the memory array is situated on the same level or below the SA. In some embodiments, the memory device is a CIM memory device configured to provide functions for applications, such as CNN applications.

At 902, the method includes sensing, using the SA, voltages stored in the memory cells and, at 904, generating sense amplifier voltages that correspond to the voltages sensed by the SA.

At 906, the method includes receiving a read column select signal at a read input, such as read input RCS (shown in FIGS. 6-11) and the read input that receives the RCS signal (shown in FIGS. 13-18), of a read circuit, such as read circuit 302 (shown in FIGS. 6-9), read circuits 400, 402, and 404 of FIGS. 10A-10C, respectively, read circuit 460 (shown in FIG. 11), read circuit 608 (shown in FIGS. 13-16), read circuits 740, 742, and 744 of FIGS. 17A-17C, respectively, and read circuit 800 (shown in FIG. 18) that is coupled to the SA to read the sense amplifier voltages. In some embodiments, the read circuit includes a first transistor, such as transistor 350, having a first gate connected to one of a bit line BL and a bit line bar BLB, i.e., an inverted bit line, of the SA and a second transistor, such as transistor 352, having a second gate at the read input RCS. In some embodiments, the read circuit includes a transistor, such as transistor 350, having a gate connected to one of a bit line BL and a bit line bar BLB of the SA and the memory device includes another transistor, such as transistor 364, having a gate connected to the other one of the bit line BL and the bit line bar BLB of the SA to balance loading on the bit line BL and the bit line bar BLB. Also, in some embodiments, the memory device includes a first read circuit including a transistor, such as transistor 350, having a gate connected to one of a bit line BL and a bit line bar BLB of the SA and a second read circuit including a transistor, such as transistor 372, having a gate connected to the other one of the bit line BL and the bit line bar BLB of the SA to provide a differential output.

In some embodiments, each read circuit includes at least two mosfets. In some embodiments, the at least two mosfets are all NMOS transistors, such as in read circuit 302 (shown in FIGS. 6-9) and read circuit 460 (shown in FIG. 11). In some embodiments, the at least two mosfets are all PMOS transistors, such as in read circuit 400 of FIG. 10A. In some embodiments, the at least two mosfets include at least one NMOS transistor and at least one PMOS transistor, such as in read circuits 402 and 404 of FIGS. 10B and 10C, respectively.

At 908, the method includes outputting output voltages from a read output port, such as read output port 356 (shown in FIGS. 6-9), read output ports 412, 426, and 446 of FIGS. 10A-10C, respectively, read output port 468 (shown in FIG. 11), read output port 654 (shown in FIGS. 13-16), read output ports 752, 766, and 786 of FIGS. 17A-17C, respectively, and read output port 808 (shown in FIG. 18) of a read circuit, such as read circuit 302 (shown in FIGS. 6-9), read circuits 400, 402, and 404 of FIGS. 10A-10C, respectively, read circuit 460 (shown in FIG. 11), read circuit 608 (shown in FIGS. 13-16), read circuits 740, 742, and 744 of FIGS. 17A-17C, respectively, and read circuit 800 (shown in FIG. 18) based on the sense amplifier voltages read by the read circuit. In some embodiments, the method includes outputting differential voltages from a first read circuit, such as read circuit 302 or read circuit 608, and a second read circuit, such as read circuit 370 or read circuit 710, coupled to the SA. In some embodiments, the method includes receiving the output voltages from the read port at an ADC, such as ADC circuit 36 or ADC circuit 506, converting the output voltages to digital data, and using the digital data from the ADC in CIM circuits, such as CIM circuits in the memory device circuits 24 and/or CIM circuits 502*a*-502*d*.

At 910, the method includes receiving a write column select signal WCS at a write input, such as the write inputs WCS (shown in FIGS. 6-9, 11, 13-16, and 18), to write data into the memory cells.

Disclosed embodiments thus provide a memory device, such as a CIM memory device, including a BEOL memory array situated above or on top of FEOL circuits, such as at least one read circuit and a SA. The read circuit is connected to the SA for reading sense amplifier voltages that correspond to voltages sensed from memory cells of the memory array by the SA. The read circuit includes a read input RCS, a read output port, and a read path that is activated by an RCS signal for reading the sense amplifier voltages during a read operation. Also, the SA includes a write input WCS that receives a WCS signal for writing the memory cells during a write operation, such that the RCS function and the WCS function are separate and decoupled from one another.

Disclosed embodiments are directed to a read circuit that includes two transistors, where the gate of one of the two transistors is connected to one of the bit line BL and the bit line bar BLB of the SA or to one of the data line DL and the data line bar DLB of the SA, and the gate of the other one of the two transistors is connected to a read input RCS that receives the RCS signal. In some embodiments, a gate of another transistor is connected to the other one of the bit line BL and the bit line bar BLB of the SA or to the other one of the data line DL and the data line bar DLB of the SA to balance loading. In some embodiments, a first read circuit is connected to one of the bit line BL and the bit line bar BLB of the SA or to one of the data line DL and the data line bar DLB of the SA and a second read circuit is connected to the other one of the bit line BL and the bit line bar BLB of the SA or to the other one of the data line DL and the data line bar DLB of the SA, to provide differential outputs for reading the memory cells. In some embodiments, the SA includes or is connected to a plurality of read circuits for reading a plurality of memory cells.

Some advantages of using the read circuit include: decoupling the RCS function and the WCS function, which simplifies read and write operations; maintaining, i.e., not disturbing, the sense amplifier voltages that correspond to the voltages from the memory cells during read operations, which improves reliability; increasing the speed of reading the memory cells, where the sense amplifier voltages are not transferred to a secondary SA to be output; and reading the sense amplifier voltages and providing corresponding output voltages through the read output port directly to the ADC or CIM circuits.

In accordance with some embodiments, a memory device includes a memory array configured to store data, a sense amplifier circuit coupled to the memory array, and a read circuit coupled to the sense amplifier circuit, wherein the read circuit includes a first input that receives a read column select signal for activating the read circuit to read the data out of the memory array through the read circuit during a read operation.

In accordance with further embodiments, a memory device includes a memory array including memory cells, a sense amplifier configured to sense voltages stored in the memory cells and provide corresponding sense amplifier voltages, and a first read circuit coupled to the sense amplifier and having a first input that receives a read column select signal for activating the first read circuit to read the sense amplifier voltages and a read port to provide output voltages based on the sense amplifier voltages, wherein the first read circuit includes a first transistor having a first drain/source path and a first gate that is connected to one of a bit line and an inverted bit line of the sense amplifier or to one of a data line and an inverted data line of the sense amplifier.

In accordance with still further disclosed aspects, a method includes: providing a memory device that includes a memory array having memory cells and a sense amplifier coupled to the memory array; sensing, using the sense amplifier, voltages stored in the memory cells; generating sense amplifier voltages that correspond to the voltages sensed by the sense amplifier; receiving a read column select signal at a first read input of a first read circuit that is coupled to the sense amplifier to read the sense amplifier voltages; outputting output voltages from a read port of the first read circuit based on the sense amplifier voltages read by the first read circuit; and receiving a write column select signal at a write input of the sense amplifier to write data into the memory cells.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory array configured to store data;
a sense amplifier circuit coupled to the memory array and having a bit line and an inverted bit line;
a first read circuit connected to one of the bit line and the inverted bit line of the sense amplifier circuit, wherein the first read circuit includes a first input that receives a read column select signal for activating the first read circuit to read the data out of the memory array through the first read circuit during a read operation; and
a load balancing transistor having a gate connected to the other one of the bit line and the inverted bit line and a drain/source path that has each side of the drain/source path connected to a reference,
wherein the other one of the bit line and the inverted bit line is connected to the gate of the load balancing transistor without being connected to a second read circuit and without being connected to another load balancing transistor.

2. The memory device of claim 1, wherein the sense amplifier circuit includes a second input that receives a write column select signal to write the data into the memory array.

3. The memory device of claim 1, wherein the first read circuit includes a first transistor having a first gate connected to the one of the bit line and the inverted bit line of the sense amplifier circuit.

4. The memory device of claim 3, wherein the first transistor includes a first drain/source path and the first read circuit includes a second transistor having a second gate connected to the first input and a second drain/source path connected to the first drain/source path of the first transistor.

5. The memory device of claim 1, wherein the sense amplifier circuit includes cross-coupled inverters connected to the bit line and the inverted bit line.

6. The memory device of claim 5, wherein the cross-coupled inverters include two PMOS transistors and two NMOS transistors.

7. The memory device of claim 1, wherein the memory array is situated one of above the sense amplifier circuit and below the sense amplifier circuit.

8. The memory device of claim 1, wherein the first read circuit includes one of all NMOS transistors, all PMOS transistors, and a combination of at least one NMOS transistor and at least one PMOS transistor.

9. The memory device of claim 1, comprising multiple memory MATs, a plurality of sense amplifier circuits, and a plurality of read circuits configured to write data into at least one of the multiple memory MATs and read data from at least one of the multiple memory MATs simultaneously.

10. A memory device, comprising:
a memory array including memory cells;
a sense amplifier having a bit line and an inverted bit line and configured to sense voltages stored in the memory cells and provide corresponding sense amplifier voltages;
a first read circuit connected to one of the bit line and the inverted bit line of the sense amplifier and having a first input that receives a read column select signal for activating the first read circuit to read the sense amplifier voltages and a read port to provide output voltages based on the sense amplifier voltages; and
a load balancing transistor having a gate connected to the other one of the bit line and the inverted bit line and a drain/source path that has each side of the drain/source path connected to a reference,
wherein the other one of the bit line and the inverted bit line is connected to the gate of the load balancing transistor without being connected to a second read circuit and without being connected to another load balancing transistor, and
wherein the first read circuit includes a first transistor having a first drain/source path and a first gate that is connected to the one of the bit line and the inverted bit line of the sense amplifier.

11. The memory device of claim 10, wherein the sense amplifier includes a second input that receives a write column select signal to write data into the memory cells.

12. The memory device of claim 10, wherein the first read circuit includes a second transistor having a second gate connected to the first input and a second drain/source path connected to the first drain/source path.

13. The memory device of claim 10, wherein the sense amplifier includes cross-coupled inverters connected to the bit line and the inverted bit line.

14. The memory device of claim 13, wherein the cross-coupled inverters include two PMOS transistors and two NMOS transistors.

15. The memory device of claim 10, comprising:
an analog-to-digital converter that receives the output voltages from the read port and converts the output voltages to digital data, such that compute-in-memory systems use the digital data from the analog-to-digital converter.

16. A method comprising:
providing a memory device that includes a memory array having memory cells and a sense amplifier coupled to the memory array and having a bit line and an inverted bit line;
sensing, using the sense amplifier, voltages stored in the memory cells;
generating sense amplifier voltages that correspond to the voltages sensed by the sense amplifier;
receiving a read column select signal at a read input of a first read circuit that is connected to one of the bit line and the inverted bit line of the sense amplifier to read the sense amplifier voltages with a load balancing transistor having a gate connected to the other one of the bit line and the inverted bit line and a drain/source path that has each side of the drain/source path connected to a reference, the other one of the bit line and the inverted bit line connected to the gate of the single load balancing transistor without being connected to a second read circuit and without being connected to another load balancing transistor;

outputting output voltages from a read port of the first read circuit based on the sense amplifier voltages read by the first read circuit; and receiving a write column select signal at a write input of the sense amplifier to write data into the memory cells.

17. The method of claim 16, wherein the first read circuit includes a first transistor having a first gate connected to the one of the bit line and the inverted bit line of the sense amplifier.

18. The method of claim 17, wherein the first transistor includes a first drain/source path and the first read circuit includes a second transistor having a second gate connected to the first input and a second drain/source path connected to the first drain/source path of the first transistor.

19. The method of claim 16, wherein sensing, using the sense amplifier, voltages stored in the memory cells includes sensing using cross-coupled inverters.

20. The method of claim 16, comprising:
receiving the output voltages from the read port at an analog-to-digital converter;
converting the output voltages to digital data; and
using the digital data from the analog-to-digital converter in CIM systems.

* * * * *